United States Patent
Minelly et al.

(10) Patent No.: US 9,014,220 B2
(45) Date of Patent: Apr. 21, 2015

(54) HIGH-POWER CW FIBER-LASER

(71) Applicant: Coherent, Inc., Santa Clara, CA (US)

(72) Inventors: John D. Minelly, San Jose, CA (US); Sergei V. Govorkov, Los Altos, CA (US); Luis A. Spinelli, Sunnyvale, CA (US); Douglas William Anthon, El Cerrito, CA (US); Jay Michael Ingalls, Folsom, CA (US)

(73) Assignee: Coherent, Inc., Santa Clara, CA (US)

(*) Notice: Subject to any disclaimer, the term of this patent is extended or adjusted under 35 U.S.C. 154(b) by 0 days.

(21) Appl. No.: 13/633,411

(22) Filed: Oct. 2, 2012

(65) Prior Publication Data
US 2013/0028276 A1      Jan. 31, 2013

Related U.S. Application Data

(63) Continuation-in-part of application No. 13/074,593, filed on Mar. 29, 2011.

(60) Provisional application No. 61/451,335, filed on Mar. 10, 2011.

(51) Int. Cl.
*H01S 3/0941*      (2006.01)
*H01S 3/042*       (2006.01)
(Continued)

(52) U.S. Cl.
CPC .............. *H01S 3/042* (2013.01); *H01S 3/06704* (2013.01); *H01S 3/08059* (2013.01); *H01S 3/09415* (2013.01); *H01S 3/06733* (2013.01); *H01S 3/0804* (2013.01); *H01S 3/094015* (2013.01); *H01S 3/105* (2013.01); *H01S 3/1062* (2013.01); *H01S 3/1618* (2013.01); *H01S 5/4012* (2013.01); *H01S 3/0407* (2013.01);

(Continued)

(58) Field of Classification Search
CPC .......... H01S 3/094096; H01S 3/08059; H01S 3/09415; H01S 3/06704; H01S 3/105; H01S 3/094053
See application file for complete search history.

(56) References Cited

U.S. PATENT DOCUMENTS

| 4,762,385 A |   | 8/1988 | Fuse |
| 4,818,062 A | * | 4/1989 | Scifres et al. ................... 385/33 |

(Continued)

FOREIGN PATENT DOCUMENTS

| DE | 4017354 A1 | 12/1991 |
| JP | 2008-21899 A | 1/2008 |

OTHER PUBLICATIONS

International Search Report and Written Opinion received for PCT Patent Application No. PCT/US2012/027445, mailed on Oct. 1, 2012, 28 pages.

(Continued)

*Primary Examiner* — Julio J Maldonado
*Assistant Examiner* — Joshua King
(74) *Attorney, Agent, or Firm* — Morrison & Foerster LLP

(57) ABSTRACT

A CW ytterbium-doped fiber-laser includes a gain-fiber having a reflector proximity-coupled to one end, with the other end left uncoated. A laser resonator is defined by the reflector and the uncoated end of the gain-fiber. Pump-radiation from fast-axis diode-laser bar-stacks emitting at 915 nm and 976 nm is combined and focused into the uncoated end of the gain-fiber for energizing the fiber. Laser radiation resulting from the energizing is delivered from the uncoated end of the gain-fiber and separated from the pump-radiation by a dichroic mirror.

9 Claims, 22 Drawing Sheets

(51) Int. Cl.
  *H01S 3/067* (2006.01)
  *H01S 3/08* (2006.01)
  *H01S 3/094* (2006.01)
  *H01S 3/105* (2006.01)
  *H01S 3/106* (2006.01)
  *H01S 3/16* (2006.01)
  *H01S 5/40* (2006.01)
  *H01S 3/04* (2006.01)
  *H01S 3/17* (2006.01)
  *H01S 5/00* (2006.01)
  *H01S 3/00* (2006.01)

(52) U.S. Cl.
  CPC ............ *H01S 3/173* (2013.01); *H01S 2301/03* (2013.01); *H01S 3/094011* (2013.01); *H01S 3/09408* (2013.01); *H01S 3/094096* (2013.01); *H01S 5/005* (2013.01); *H01S 3/005* (2013.01); *H01S 3/0401* (2013.01)

(56) References Cited

U.S. PATENT DOCUMENTS

| | | | | |
|---|---|---|---|---|
| 5,268,978 | A | * | 12/1993 | Po et al. .................. 385/33 |
| 5,379,315 | A | * | 1/1995 | Meinzer .................. 372/55 |
| 5,533,163 | A | * | 7/1996 | Muendel .............. 385/126 |
| 5,689,522 | A | * | 11/1997 | Beach .................... 372/75 |
| 5,943,463 | A | * | 8/1999 | Unuma et al. .......... 385/119 |
| 5,946,437 | A | | 8/1999 | Uchida et al. |
| 6,167,177 | A | | 12/2000 | Sandstrom et al. |
| 6,400,513 | B1 | * | 6/2002 | Southwell .............. 359/641 |
| 6,948,862 | B2 | | 9/2005 | Brown |
| 7,369,582 | B2 | | 5/2008 | Kumkar et al. |
| 7,540,668 | B2 | | 6/2009 | Brown |
| 7,903,696 | B2 | | 3/2011 | Klebanov |
| 2004/0081396 | A1 | * | 4/2004 | Komine et al. .......... 385/33 |
| 2006/0280208 | A1 | | 12/2006 | Baev et al. |
| 2007/0172174 | A1 | | 7/2007 | Scerbak et al. |
| 2009/0190218 | A1 | * | 7/2009 | Govorkov et al. ......... 359/495 |
| 2010/0247055 | A1 | | 9/2010 | Arashitani et al. |
| 2010/0260210 | A1 | | 10/2010 | Spinelli et al. |

OTHER PUBLICATIONS

Non Final Office Action received for U.S. Appl. No. 13/074,593 mailed on Apr. 12, 2013, 19 pages.

Jeong et al., "Multi-Kilowatt Single-Mode Ytterbium-Doped Large-Core Fiber Laser", Journal of the Optical Society of Korea, vol. 13, No. 4, Dec. 2009, pp. 416-422.

Minelly et al., All-Glass kW Fibre Laser End-Pumped by MCCP-Cooled Diode Stacks, 2011 Con Ference on Lasers and Electro-Opti Cs Eu Rope and 12th European Quantumelectroni Cs Conference (Cleo Europe/Eqec), May 1, 2011, 1 page.

Wang et al., "Analysis of Raman and Thermal Effects in Kilowatt Fiber Lasers", Optics Communications, vol. 242, 2004, pp. 487-502.

Invitation to Pay Additional Fees received for PCT Patent Applcation No. PCT/US2012/027445, mailed on Jun. 6, 2012, 6 pages.

Final Office Action received for U.S. Appl. No. 13/074,593, mailed on Oct. 30, 2013, 19 pages.

International Preliminary Report on Patentability received for PCT Patent Application No. PCT/US2012/027445, mailed on Sep. 19, 2013, 17 pages.

Non-Final Office Action received for U.S. Appl. No. 13/074,593, mailed on Sep. 25, 2014, 15 pages.

\* cited by examiner

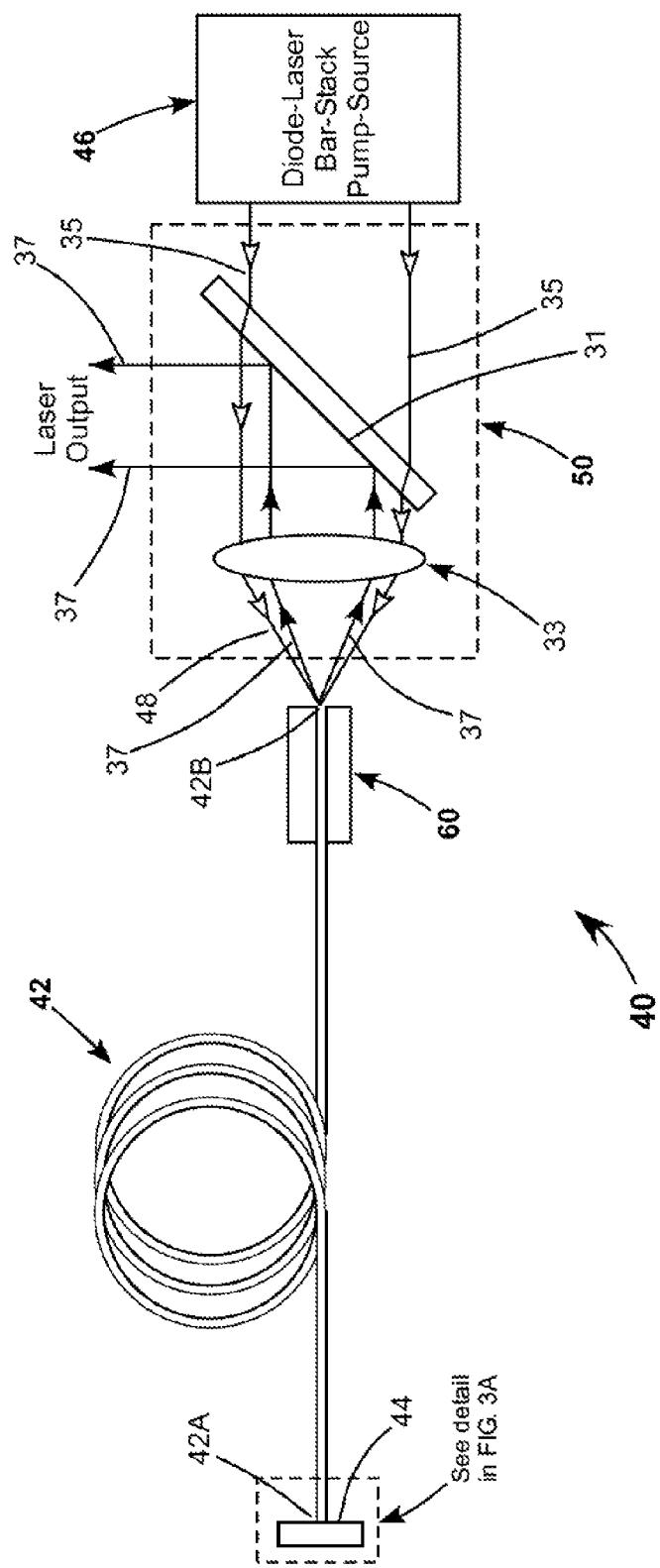
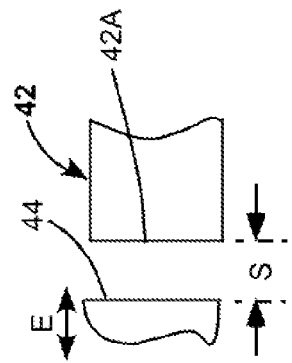
FIG. 3
FIG. 3A

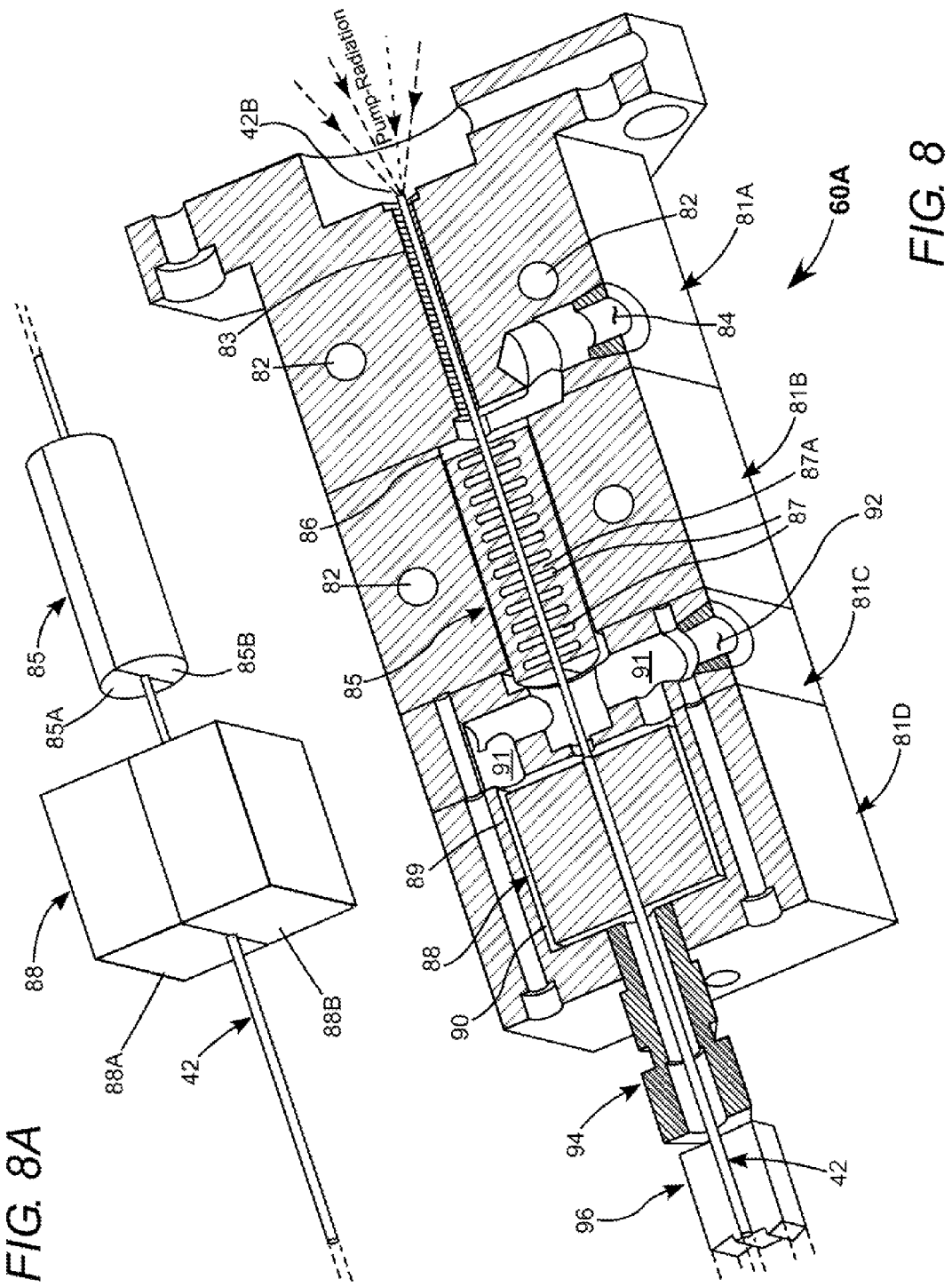

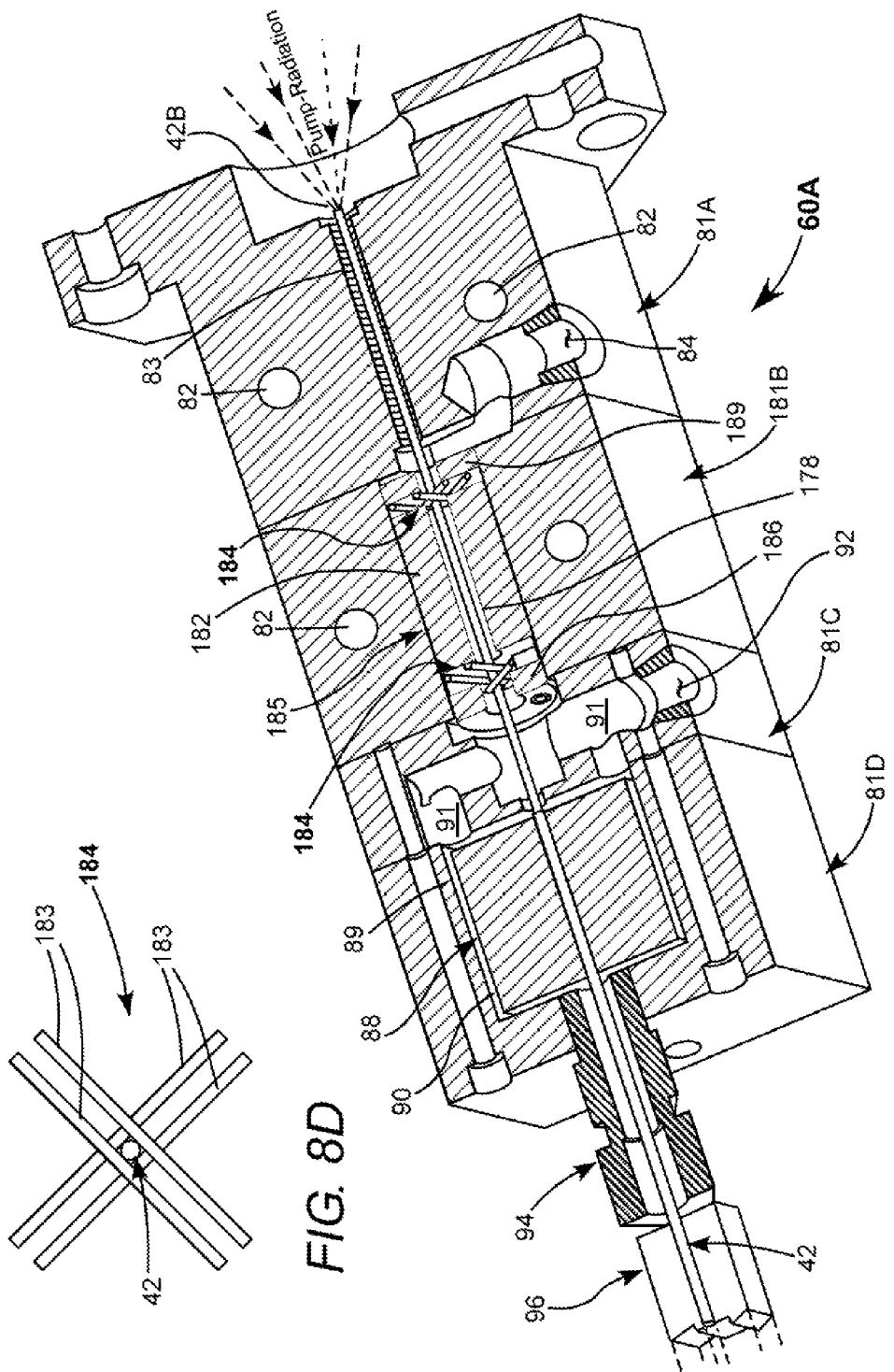

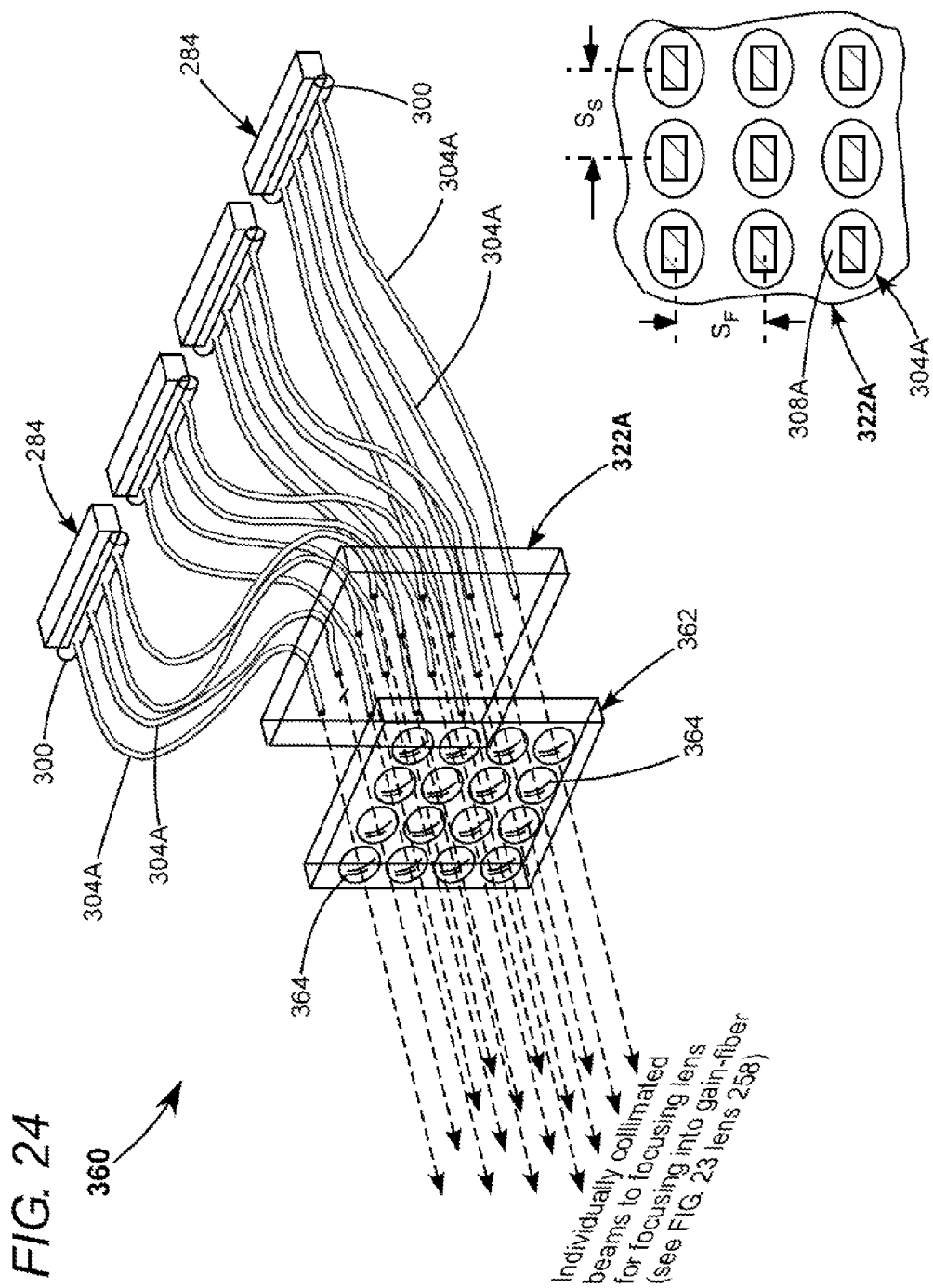

HIGH-POWER CW FIBER-LASER

PRIORITY CLAIM

This application is a continuation in part of U.S. patent application Ser. No. 13/074,593, filed Mar. 29, 2011, which in turn claims priority to U.S. Provisional Application Ser. No. 61/451,335, filed Mar. 10, 2011, the disclosure of which is incorporated herein by reference.

TECHNICAL FIELD OF THE INVENTION

The present invention relates in general to fiber-lasers. The invention relates in particular to high-power, continuous wave (CW) fiber-lasers.

DISCUSSION OF BACKGROUND ART

Fiber-lasers are gradually replacing conventional solid-state lasers in several laser applications. Fiber-lasers have advantages over solid-state lasers in ruggedness and optical efficiency. CW fiber-lasers are capable of delivering a very high-powered beam, for example, a beam having a power in excess of 1 kilowatt (kW). Pulsed fiber-lasers can deliver peak-power as high as 10 kW or greater. Fiber-lasers can have a high optical efficiency, for example between about 60% and 90%.

High-power CW fiber-lasers with multimode output are extremely useful in material processing applications, such as cutting of complex 3D shapes found in hydro-formed automotive parts and long-offset welding of complex-shaped parts. High peak-power pulsed fiber-lasers with single mode output can be used for scribing of solar-cell panels. Advantageously, high peak-power enables efficient frequency-conversion into visible and UV wavelength ranges.

In theory at least, the output power of a fiber-laser is limited only by how much optical pumping power can be delivered into an optical gain-fiber for energizing a doped-core of the gain-fiber. In practice, there are limits due, inter alia, to non-linear effects which can broaden the spectrum of pump radiation resulting in reduction of absorption efficiency, and photo-darkening of the fiber material which can lead to reduction of efficiency, excessive heating, and even catastrophic failure. The non-linear effects become increasingly problematical as the gain-fiber is longer. Long gain-fibers are necessary with low brightness diode-laser pump sources currently available.

FIG. 1 schematically illustrates a prior-art fiber-laser arrangement 10. Laser 10 includes a gain-fiber 12 having a doped core (not shown). Pump radiation from a plurality of diode-laser modules 18 is coupled into the cladding of the gain fiber via N-to-1 couplers 20 spliced to the gain fiber. Only two diode-laser modules per coupler are depicted in FIG. 1 for simplicity of illustration. In practice there be as many as 6 diode-lasers inputting to a 6-to-1 coupler. Pump radiation is coupled into both ends of the gain-fiber.

A resonant cavity extending through the gain-fiber is formed by fiber Bragg gratings (FBGs) 14 and 16 written in passive fibers 15 spliced to the central fiber of the coupler. FBG 14 is maximally reflecting at a lasing wavelength of the gain-fiber and FBG 16 is partially transmissive at that wavelength to allow laser output. The output may be delivered for use in an application or passed on to one or more stages of amplification. This arrangement would require fiber splices (depicted by a bold "X" in FIG. 1) between the diode-laser modules and the couplers, between the couplers and the gain fiber, and between the couplers and the FBG fibers.

Fiber-splices and FBGs can be a source of instability due to transverse mode-coupling. Other issues include grating walk-off and modal instability. The latter issue arises because the fibre laser community, for the most part, is focussed on single-transverse-mode operation of the fiber-lasers in spite of the fibres themselves being multimode to avoid nonlinear impairments. Any fiber-splice is potentially a source of loss, due to less-than-perfect core-alignment, and potentially a source of mechanical failure. Clearly, the more splices the greater will be the potential for problems resulting from the aforementioned issues.

A method of pumping a gain-fiber which does not require fiber splices is to directly focus radiation from an array of diode-laser emitters into the gain-fiber. A one-dimensional array of diode-laser emitters is typically referred to as a diode-laser bar.

The emitters have an emitting aperture about 1 micrometer (μm) high (in what is referred to as the fast-axis of the emitter) and a width from about 10 μm to over 100 μm (in what is referred to as the slow-axis of the emitter). The bars are usually about 1 centimeter (cm) long and between about 1 and 4 millimeters (mm) wide, with the emitters having a length in the width-direction of the bar and emitting apertures aligned in the slow-axis direction. Typical diode-laser bars include about 20 emitters with a fill factor of about 20%. If more radiation is required than can be provided by a one-dimensional array, a two-dimensional array of emitters can be formed by stacking a plurality of diode-laser arrays, one above the other in the fast-axis direction, but the separation between bars in the stacking direction is usually greater than about 1.5 millimeters (mm) to allow for each bar to be mounted on a thermally conductive sub-mount for cooling. This provides an aggregate beam which has a radially asymmetric cross-section, being much longer in the fast-axis direction than in the slow-axis direction.

Two-dimensional arrays of this kind can have as many as twenty diode-laser bars vertically stacked providing a total output of a few kilowatts. Such arrays are typically used for heat-treatment of metals and the like where accurate focusing is not required and radial asymmetry is not a problem. This radial asymmetry, however, makes focusing into a gain-fiber difficult and inefficient at best.

In U.S. Pre-Grant Publication No. 2010/0260210 gain-fiber pumping method is described wherein a plurality of diode-laser bars is used to optically pump a corresponding plurality of external-cavity vertically-emitting optically-pumped semiconductor (OPS) lasers with radiation from the OPS-lasers being used to directly pump a gain-fiber. FIG. 2 schematically illustrates a simplified arrangement 22 for carrying out this method. Here, gain-fiber 12 includes FBGs 14 and 16 forming a resonator as described above. Gain-fiber 12 has a doped core 17 surrounded by an inner cladding 19 which is surrounded by an outer cladding 21.

Optical pump radiation is provided by a pump module 23 including plurality of OPS-lasers 24. Each laser delivers a beam of radiation 25 preferably in a single lateral mode or at least a "low-$M^2$" (for example $M^2<2$) mode. The beams are collimated, and are directed parallel to each other, here, by an arrangement of turning minors 27, to a positive lens 28. Radiation from all of the beams is focused by lens 28, as indicated by converging rays 29, into inner cladding 19 of gain-fiber 16, with a small portion, of course, directed into core 17. It is taught that in practice, as many as two-hundred fifty beams having $M^2<2$ may be directed onto lens 28 and focused into a gain-fiber having an inner cladding diameter of about 100 μm and a numerical aperture (NA) of about 0.22. Assuming a relatively modest output power of about 30 W for a single-chip OPS laser, it is possible to couple as much as 7.5 kW of radiation into such a gain-fiber.

This pumping method uses the OPS-lasers essentially as "brightness converters" to convert poor-quality low-brightness diode-laser beams into high quality, high brightness laser beams. It remains to be seen, however, whether the advantage of efficient focusing of the OPS-laser beams is sufficient to offset the less-than-100% efficiency of conversion, the cost of the OPS-lasers, and the cost of a beam-combining arrangement for as many as two-hundred fifty OPS laser-beams. There remains a need to develop an effective method of direct pumping using two-dimensional diode-laser arrays.

SUMMARY OF THE INVENTION

In one aspect, laser apparatus in accordance with the present invention comprises a gain-fiber having first and second opposite ends and having a fundamental emission wavelength for laser radiation. The gain-fiber provides optical gain over a characteristic gain-bandwidth. A laser resonator is defined by the first end of the gain-fiber and a minor proximity-coupled to the second end of the gain-fiber. A first source of optical pump-radiation provides pump-radiation having a first pump-radiation wavelength. A second source of optical pump-radiation provides pump-radiation having a second pump-radiation wavelength different from the first pump-radiation wavelength. A dichroic beam combiner is provided for combining the first-wavelength and second-wavelength pump radiations. The mirror is highly reflective for wavelengths within the gain-bandwidth of the fiber, highly reflective for the first and second pump-radiation wavelengths, and highly transmissive for radiation having wavelengths longer than the gain-bandwidth. A focusing lens is configured to focus at least a substantial portion of combined first and second wavelength pump radiations into the first end of the gain-fiber, thereby causing laser-radiation at a natural wavelength within the gain-bandwidth to be generated in the laser-resonator, and delivered from the first end of the gain-fiber as output radiation. The gain-fiber is configured and arranged such that the generated and delivered radiation is multiple-lateral-mode radiation, and the transmission wavelengths of the mirror are selected such that collateral generation of stimulated Raman scattering is minimized.

BRIEF DESCRIPTION OF THE DRAWINGS

The accompanying drawings, which are incorporated in and constitute a part of the specification, schematically illustrate a preferred embodiment of the present invention, and together with the general description given above and the detailed description of the preferred embodiment given below, serve to explain principles of the present invention.

FIG. 3 schematically illustrates a basic embodiment of a fiber-laser in accordance with the present invention including a gain-fiber having a maximally reflective minor proximity-coupled to one end thereof and being uncoated at the other end, a diode-laser bar-stack pump-source providing pump-radiation for the gain-fiber, an optical arrangement for focusing the pump-radiation into the uncoated end of the fiber and separating laser output radiation from the uncoated end of the fiber from the counter-propagating pump-radiation.

FIG. 3A is a fragmentary view schematically illustrating details of the proximity coupling of the maximally reflective mirror of FIG. 3 with the minor being axially translatable with respect to the end of the gain-fiber.

FIG. 8 is a three-dimensional longitudinal cross-section view schematically illustrating details of the coupler in the fiber-laser of FIG. 5 including a conduction-cooled ferrule surrounding and end of the gain-fiber from which the polymer layers have been stripped and an air-cooled block surrounding a portion of the fiber with polymer layers present.

FIG. 8A is a three dimensional view schematically illustrating further details of the ferrule and cooling block of the coupler of FIG. 8.

FIG. 8C is a three-dimensional longitudinal cross-section view schematically illustrating details of an arrangement of the coupler of FIG. 8 including a ferrule wherein the fiber is suspended by two crossed pairs of fibers.

FIG. 8D is a detailed view of one crossed fiber pair support of the embodiment of FIG. 8C.

FIG. 22A is a fragmentary view of the rectangular fiber-array of FIG. 22 illustrating rectangular fiber cores aligned both the widths and heights thereof parallel to each other for preserving the polarization-plane orientation of the diode-laser emitters.

FIG. 24 is a three-dimensional view schematically illustrating another example of a pump-radiation source in accordance with the present invention including four four-emitter packages similar to the package of FIG. 20 with output ends of sixteen fibers arranged in a rectangular array delivering sixteen laser beams, the beams being individually collimated by an array of sixteen individual lenses.

FIG. 24A is a fragmentary view of the rectangular fiber-array of FIG. 24 illustrating rectangular fiber cores aligned both the widths and heights thereof parallel to each other for preserving the polarization-plane orientation of the diode-laser emitters, each core surrounded by cladding having an elliptical cross-section for facilitating the alignment of heights and widths.

DETAILED DESCRIPTION OF THE INVENTION

Figure 1:
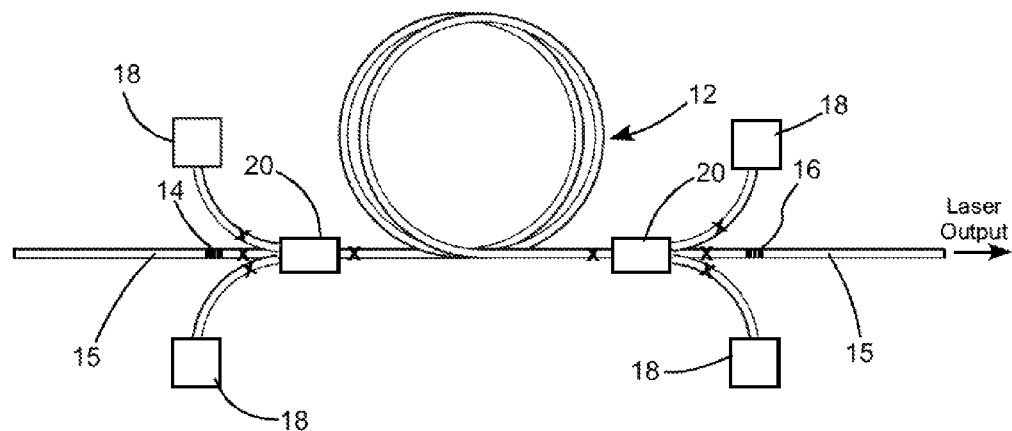
FIG. 1 schematically illustrates one prior-art fiber-laser arrangement with pump-radiation from a plurality of diode-lasers coupled into the cladding a gain-fiber using a plurality of N-to-1 fused fiber couplers.
Figure 2:
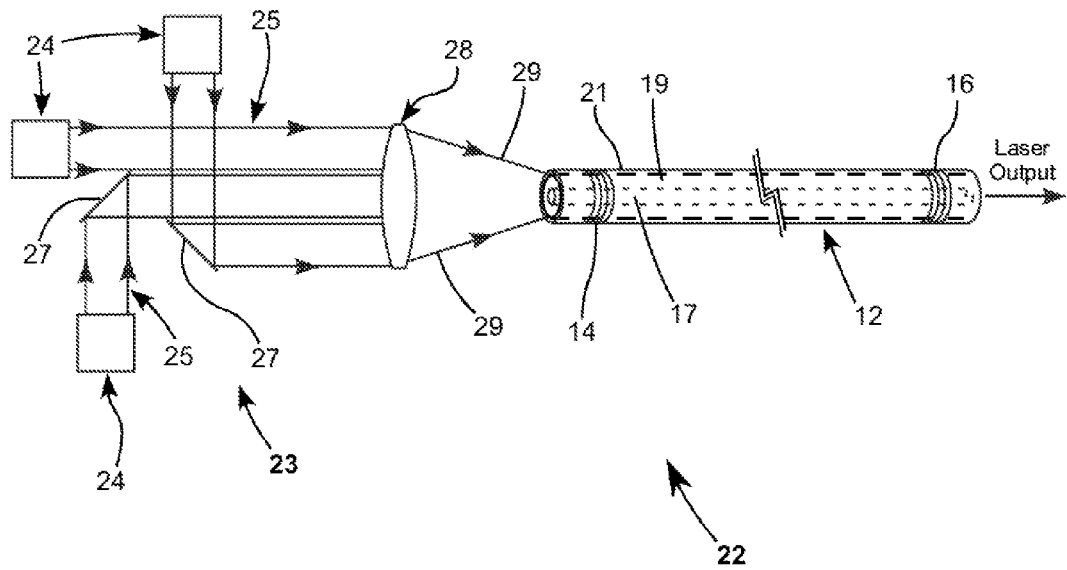
FIG. 2 schematically illustrates another prior-art fiber-laser arrangement with pump-radiation from a plurality of OPS-lasers focused into a gain-fiber by a single lens.

Continuing with reference to the drawings, wherein like components are designated by like reference numerals, FIG. 3 schematically illustrates a basic embodiment 40 of a fiber-laser in accordance with the present invention. Laser 40 includes a multi-mode gain-fiber 42 having a mirror 44 which is maximally reflective in the gain-bandwidth of the gain-fiber and proximity-coupled to one end 42A of the gain-fiber. The opposite end 42B of the gain-fiber is preferably left uncoated, which provides for only about 4% reflectivity, not significantly wavelength selective. This low reflectivity provides a very high (96%) output-coupling percentage for a resonator formed between mirror 44 and the uncoated end of the gain-fiber. In the inventive fiber-laser, output-coupling greater than 90% is preferred.

Pump-radiation for gain-fiber 42 is supplied by a diode-laser bar-stack source 46 including a plurality of diode-laser bars (not shown in FIG. 3). A combined collimated beam from the diode-laser bars is designated by bounding rays 35 thereof. Beam 48 is transmitted through a dichroic mirror 31 in an optics module 50 and is focused by optics 33 (depicted as a single lens element for simplicity of illustration) into end 42B of the gain-fiber. Dichroic mirror 31 is highly transmissive for the pump-radiation wavelength and maximally reflective for the wavelengths in the gain-bandwidth of the gain-fiber. Minor 44 is also highly reflective for the pump-radiation wavelength to provide for double-pass absorption of pump-radiation in the gain-fiber. This particular architecture provides for multi-mode (multiple lateral mode) operation of the laser. The multi-mode laser-radiation 37 delivered from gain-fiber 42 is collimated by optics 33 and reflected by dichroic mirror 31 out of optics module 50 as laser output.

A coupler 60 is provided around end 42B of the gain-fiber. This coupler is provided to absorb and remove pump-radiation that cannot propagate in a first cladding (not shown) of the gain-fiber to prevent damage to the gain-fiber. A detailed description of a preferred arrangement of coupler 60 is provided further hereinbelow.

FIG. 3A is a fragmentary view schematically illustrating details of the proximity coupling of mirror 44 to the gain fiber. The term proximity-coupling indicates that the mirror can be spaced by a relatively small distance S from end 42 the gain fiber with the gain-fiber with distance S being sufficiently small that a diverging beam of laser radiation leaving the core of the gain-fiber will be directed back into the gain-fiber, without the assistance of any intermediate optical element, without an unacceptable loss. This is facilitated by a relatively large diameter of the multi-mode fiber core. In one example laser in accordance with the present invention, a spacing distance up to 100 micrometers (μm) has been found acceptable.

This proximity coupling provides that the mirror can be mounted in a fixture for precise alignment. In a discussion of experimental results provided further hereinbelow advantages of making distance S selectively variable, for example by selectively axially translating the mirror as indicated by arrows E, are discussed. The mirror can be considered as forming an asymmetrical etalon having a cavity thickness S with the end of the gain-fiber. Alternatively the air space can be considered as a variable thickness air-layer on the mirror so there is a variable wavelength selective modulation of the reflectivity across an otherwise broad reflection band.

Figure 4:
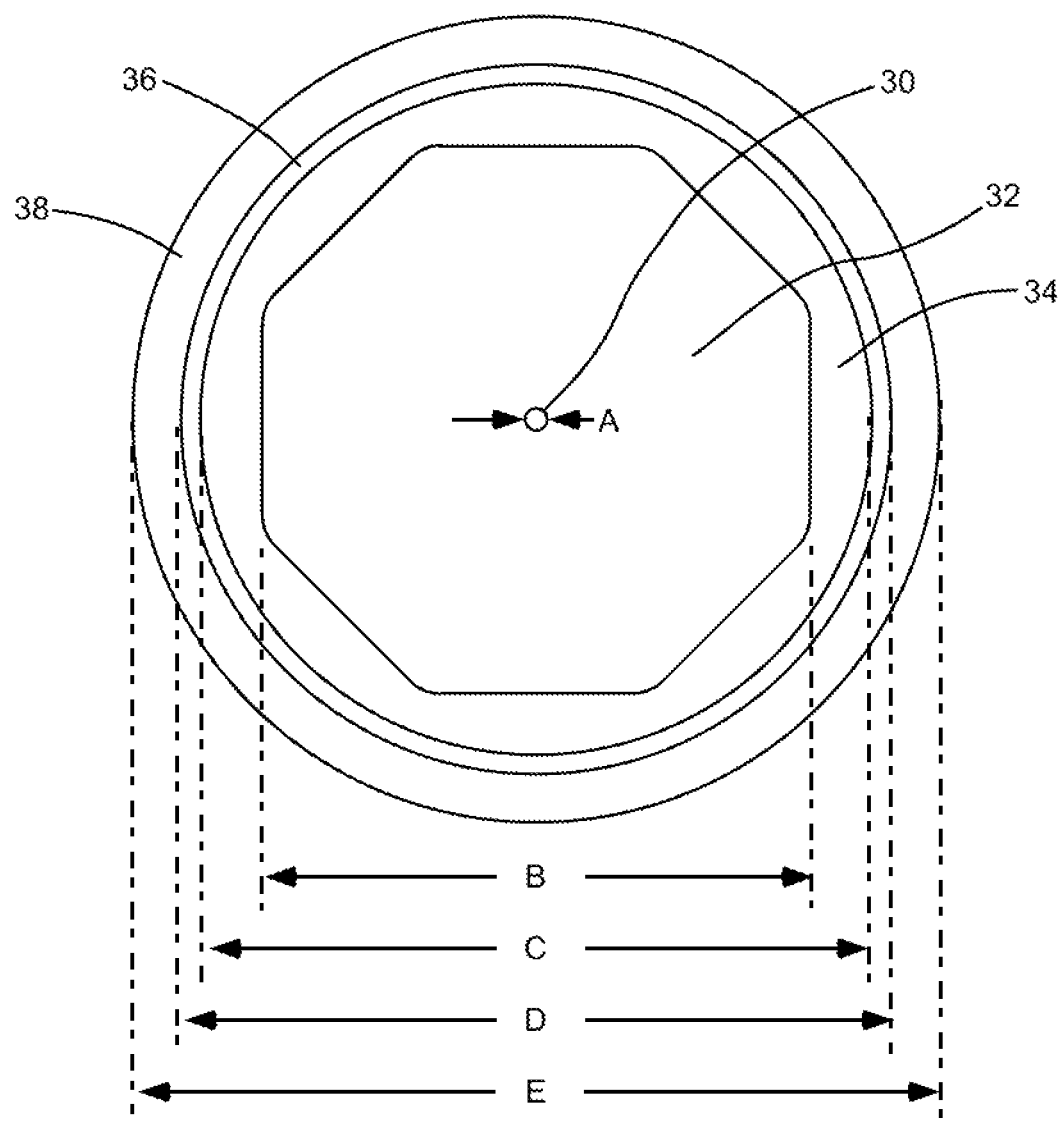
FIG. 4 is an un-shaded cross-section view schematically illustrating a preferred configuration a gain-fiber for use in a fiber-laser in accordance with the present invention, including a core, a first cladding surrounding the core, a second cladding surrounding the first cladding, a primary polymer layer surrounding the second cladding and a secondary polymer layer surrounding the primary polymer layer.

FIG. 4 is an un-shaded cross-section view schematically illustrating a preferred configuration gain-fiber 42. The gain-fiber includes an alumino-silicate core 30 doped with between about 0.4 to 1.0 weight % ytterbium (Yb). This core has a refractive index of about 1.452. Laser-radiation at a wavelength of about 1100 nm is generated when the core is pumped by pump-radiation having a wavelength of between about 915 and 980 nm.

Surrounding core 30 is a first cladding 32 of fused silica having an octagonal cross-section. This cladding has a refractive index at the laser wavelength of about 1.45 which provides for a core NA of about 0.06. Surrounding cladding 32 is a second cladding 34 of fluorine-doped glass. The first cladding has a lower refractive index than the core for retaining laser radiation in the core. The second cladding 34 has a lower refractive index than the first cladding 32 for retaining pump-radiation in the first cladding. In this preferred example, cladding 34 has a refractive index at the pump wavelength of 1.433, which provides for a pump radiation NA of about 0.22.

A primary polymer layer 36 surrounds second cladding layer 34. The primary polymer layer is a layer of fluoroacrylate having a refractive index 1.37, i.e., less than that of second cladding 34. A secondary polymer layer 38 surrounds primary polymer layer 36. This secondary polymer layer is a layer of acrylate having a refractive index of 1.52, i.e., greater than that of the primary polymer layer.

Regarding dimensions of the gain-fiber core and layers, core 30 is a multimode core having a diameter (A) of about 30.0 micrometers (μm). Octagonal cladding 32 measures 606 μm (B) across the flat portions. Layers 34, 36 and 38 have outside diameters C, D, and E of 728 μm, 775 μm, and 877 μm, respectively.

Figure 5:
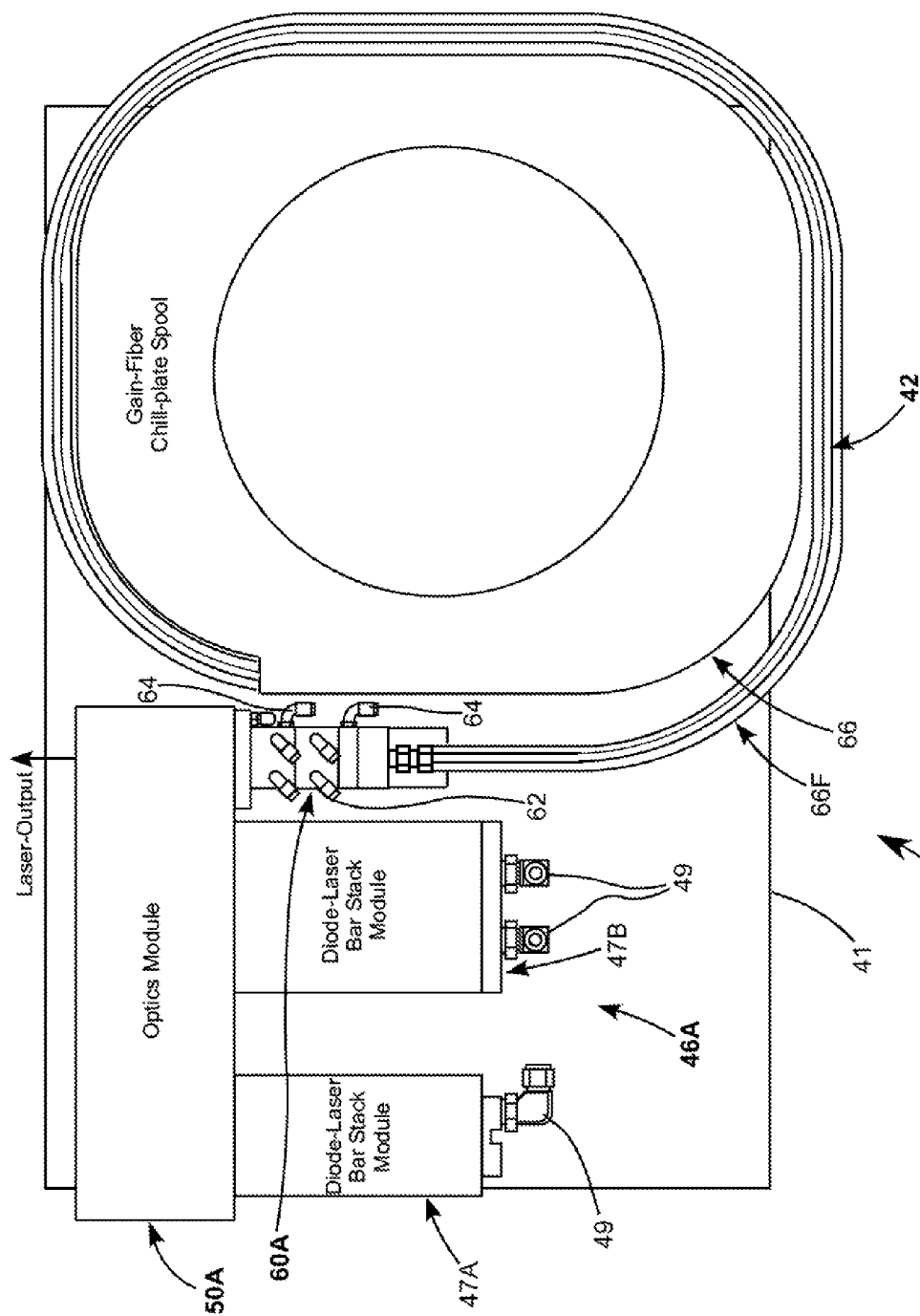
FIG. 5 schematically illustrates a preferred embodiment of a fiber-laser in accordance with the present invention including a gain-fiber, a pump-radiation source including two diode-laser bar-stack modules, an optics module for combining beams from the diode-laser bar-stack modules and focusing the combined beams into an uncoated end of the gain-fiber, and a coupler arrangement surrounding the gain-fiber around the uncoated end thereof for removing pump-radiation which cannot propagate in the gain-fiber.

FIG. 5 schematically illustrates a preferred embodiment 40A of a fiber-laser in accordance with the present invention including a gain-fiber. Components of the laser are assembled here on a base 41. A pump-radiation source 46A includes two diode-laser bar-stack modules 47A and 47B. These bar-stack modules are essentially identical but with one rotated at 90 with respect to the other for reasons discussed further hereinbelow. The diode-laser bar-stack in each bar-stack module is fluid cooled via inlets and outlets 49.

The bar-stack modules deliver pump-radiation into an optics module 50A which performs functions similar to those performed by optics module 50 of laser 40 of FIG. 3. Coupler 60A has a four-part body with parts nearest end 42B of the gain-fiber being fluid-cooled via inlets and outlets 62. Certain internal components of the coupler are air-cooled via inlet couplers 64. Further details of the coupler are presented further hereinbelow.

Gain-fiber 42 is preferably cooled along the entire length of the fiber. Most of the gain-fiber is retained in a spiral groove (not visible) in a fluid-cooled spool 66. The terminal minor of the gain-fiber, corresponding to minor 44 of FIG. 3 is obscured by the spool. In this embodiment of the inventive fiber-laser, gain-fiber 42 has a length of about sixty-five meters (65 m). Between the output of coupler 60A and the spool the gain-fiber is retained in a groove in a fluid-cooled flexure 66A separate from spool 66. Other methods of cooling the fiber between the coupler and the spool are possible at relatively low power. One method is to simply cool the fiber with flowing air from a fan.

The bend radius of the gain-fiber is preferably greater than about 8 inches for the fiber cross-section dimensions exemplified above, this relatively large bend radius being selected for minimizing differential modal gain. Minimizing this differential modal gain is important in achieving stable laser operation. This large bend radius in turn enables efficient use of the 0.22 NA all-glass fluorosilicate cladding that essentially eliminates any issues of degradation of the polymer layer by the high power light propagation.

The gain-fiber as described above with reference to FIG. 4 can deliver about 1.0 kW of multi-mode radiation from the uncoated end thereof when pumped with pump-radiation having a power about equal to or greater than about 1.4 kW. It should be noted that components depicted in FIG. 5 are relatively to scale with the exception of the diameter of the gain-fiber which is exaggerated for convenience of description.

Figure 6:
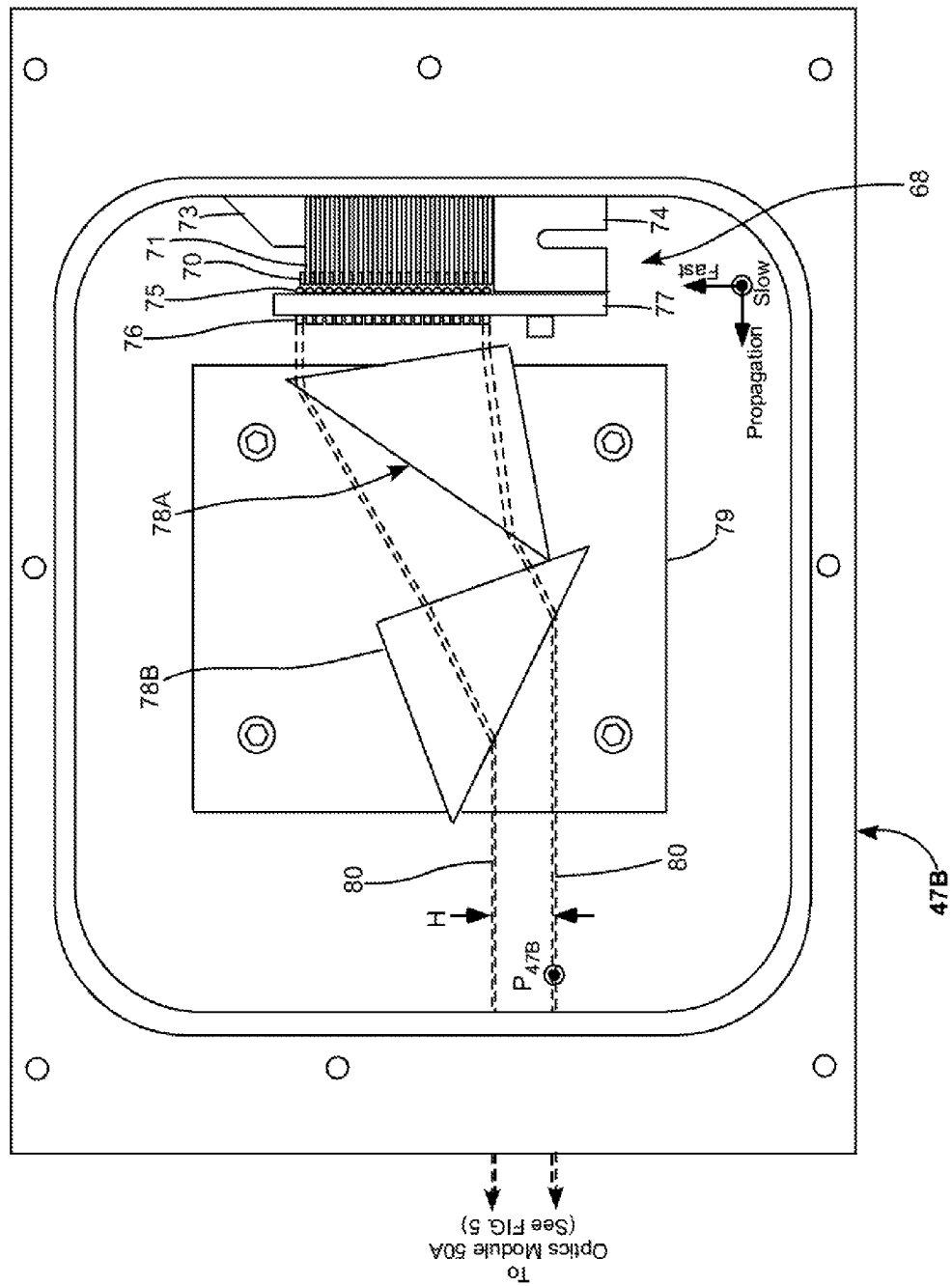
FIG. 6 schematically illustrates details of a diode-laser bar-stack module of the fiber-laser of FIG. 5.

FIG. 6 schematically illustrates bar-stack module 47B with a cover removed to show internal components of the module. A diode-laser bar-stack 68 includes twenty diode-laser bars 70 stacked in the fast-axis direction of the diode-laser bars. Such a stack may be referred to as a fast-axis diode-laser bar-stack. Each diode-laser bar is mounted on a thermally conductive sub-mount 71. The sub-mounts are clamped between fluid-cooled (water-cooled) members 73 and 74. Such a fast-axis diode-laser bar-stack is commercially available from Coherent Inc. of Santa Clara, Calif. as an Onyx MCCP 9010-HDPKG diode-laser bar-stack. In such a stack, the fast-axis stacking pitch of the bars is 1.6 mm. A twenty-bar-stack delivers about 1.0 kW of radiation. In this example, the pump-radiation from the bar-stack has a wavelength of about 976 nm. Associated with each diode-laser bar are a fast-axis collimating lens 75 and a slow-axis collimating-lens array 76, with the array having one lens for each emitter in the diode-laser bar. Here, the lenses are supported on a frame 77 bolted to member 74.

Dashed lines 80 indicate the path of collimated beams from uppermost and lowermost ones of the diode-laser bars 20. Beams from all of the diode-laser bars will have a total fast-axis height of about 32.0 mm leaving the slow-axis lens arrays. The width of the combined beams will be about 10.0 mm which is the slow-axis length of an individual diode-laser bar. A pair of prisms, 78A and 78B, mounted on a base 79, form an anamorphic beam-compressor. This beam compressor reduces the total fast-axis height (H) of the beams to about 11.0 mm, so the fast and slow axis dimensions of the beams are about equal. Radiation in the beams is plane-polarized with the polarization-plane aligned with the slow-axis, i.e., perpendicular to the plane of the drawing as indicated by arrowhead $P_{47B}$. The fast-axis-compressed beams are delivered to optics module 50A. A cylindrical telescope could be substituted for prisms 78A and 78B for reducing the fast-axis beam dimension without departing from the spirit and scope of the present invention.

Figure 7:
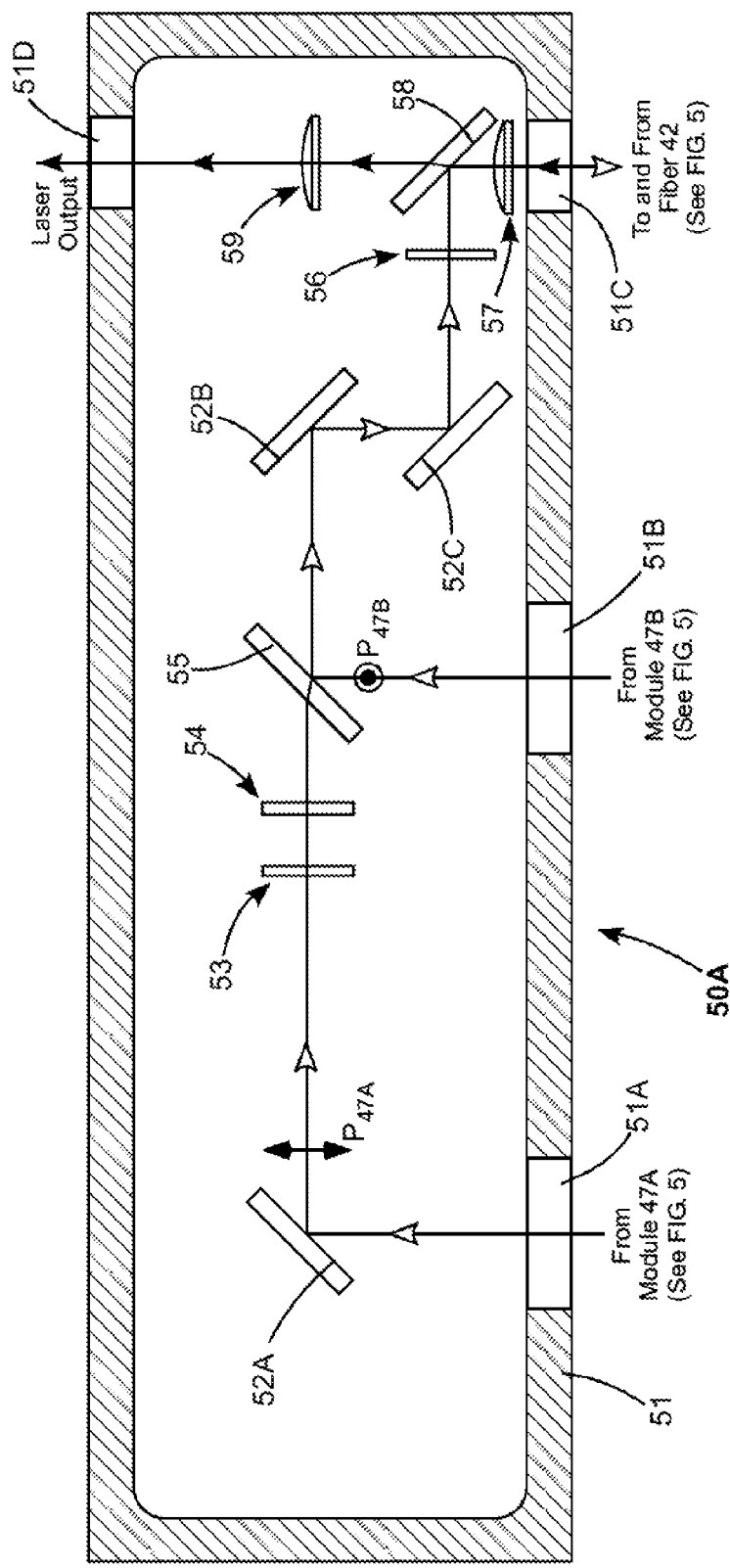
FIG. 7 schematically illustrates details of optical arrangements in the optics module of the fiber-laser of FIG. 5.

FIG. 7 schematically illustrates a preferred arrangement of optics in optics module 50A of laser 40A of FIG. 5. In this illustration, only one axial ray of each beam, entering, leaving, or propagating in the module is depicted for simplicity of illustration. Pump-radiation is designated by open arrowheads and laser-radiation is designated by solid arrowheads.

Optical elements are contained in an enclosure 51. Pump-radiation from diode-laser bar-stack modules 47A and 47B enters the enclosure via apertures 51A and 51B, respectively, in the enclosure. Since diode-laser bar-stack module 47A is rotated at 90° with respect to module 47B, the polarization-plane of radiation from module 47A is oriented at 90° to the polarization-plane of radiation from module 47B, as indicated in FIG. 7 by arrows $P_{47A}$ and arrowhead $P_{47B}$.

Radiation from module 47A is directed by a turning mirror 52A through lens elements 53 and 54 to a polarization-sensitive beam-combiner 55. Beam-combiner 55 is highly transmissive for radiation p-polarized with respect to the beam-combiner and highly reflective for radiation s-polarized with respect to the beam-combiner. Beams from the two diode-laser bar-stack modules are combined along a path to turning mirror 52B. Power in the combined beams is about 1.6 kW in this example. The purpose of lens elements is to compensate for size-differences between beams from the two diode-laser bar-stack modules due to less-than-perfect collimation and different path lengths to dichroic beam-combiner 55.

If the fast-axis to slow-axis ratio of each beam is not exactly unity, the 90°-rotation of the beams with respect to each other provides that the combined beam leaving beam-combiner 55 has a symmetrical cross-section. The combined beam cross-section, however, will not be circular, and the intensity distribution across the beam will be a complex, non-Gaussian distribution. This beam conditioning of anamorphic compression in the fast axis and crossed-axes to achieve beam symmetry facilitates focusing into the gain-fiber. However, it can be stated that the pump-radiation beam has poor quality as far as spatial intensity-distribution is concerned.

Leaving beam combiner 55, the combined pump-radiation beams are directed by turning mirrors 52B, 52C, and a dichroic beamsplitter 58 towards gain-fiber 42. The combined beams are focused by lens elements 56 and 57 through aperture 51C into the gain-fiber. Laser radiation emitted from the gain-fiber as a result of optical pumping is collimated by lens element 57. Dichroic beamsplitter 58 is highly reflective for the wavelength of pump radiation and highly transmissive for the laser-radiation wavelength. Collimated laser radiation is transmitted through dichroic beamsplitter 58 and exits enclosure 51 via aperture 51D therein as laser output-radiation. Optionally, a lens element 59 can be provided for focusing the output-radiation into a transport fiber (not shown).

It should be noted here that while the outputs of only fast-axis diode-laser bar-stacks are polarization combined in the above-discussed example to provide a pump-radiation power greater than one kilowatt, the output of more such stacks can be combined to provide even greater pump-radiation power. By way of example the output of one diode-laser bar-stack having an output wavelength of 915 nm may be spectrally combined using a dichroic beam-combiner with the output of another diode-laser bar-stack having an output wavelength of 976 nm, with the polarization-plane of the stacks being the same orientation. Both wavelengths are suitable of pumping a Yb-doped gain-fiber. Another two diode-laser bar-stacks can be similarly spectrally combined and the output of one spectrally combined pair can be polarization combined to provide a combined output of four diode-laser bar-stacks. Those skilled in the art will recognize from this description that other bar-stack combinations are possible without departing from the spirit and scope of the present invention.

In prior-art fiber-lasers there is typically a length of passive fiber spliced to the end of the gain-fiber (active fiber) and pump-radiation is focused into the passive fiber and transferred to the first cladding of the active fiber. One reason for doing this is that the active fiber dissipates a certain percentage, for example between about 20% and 50% of the pump radiation as heat as optical conversion is not 100%-efficient. Accordingly, the active fiber needs to be cooled everywhere along its length as discussed above.

In a fiber-laser in accordance with the present invention, pump-radiation is focused directly into the gain-fiber (active fiber). A primary reason for doing this is to avoid the potential inefficiency and unreliability of a passive-fiber to active-fiber splice.

The pump radiation beam focused directly into gain-fiber 42, while having a more or less symmetrical cross-section, is of relatively poor spatial uniformity as described above. A result of this is that the focused beam has a significant amount of its energy content outside of the convergence angle that can be focused into the first cladding. Accordingly, several hundred Watts of power misses end 42B of the fiber and needs to be dissipated without overheating and damaging the fiber and components supporting it.

Additionally, fibers have a limited acceptance angle defined by their NA (numerical aperture). Here again, due to the poor spatial quality of the pump-radiation, a significant portion of power initially focused into the fiber lies outside this acceptance angle. A result of this is that this portion eventually escapes the fiber and could cause heating and damage to anything surrounding the fiber. Yet another portion of the pump radiation continues to propagate in the second cladding. Gain-fibers typically have a protective coating made of one or more layers of organic (polymer) material. A portion of the light propagating in the second cladding eventually couples into the polymer coating and would cause damage if of sufficient intensity and in the absence of a cooling means. A significant challenge in directly pumping gain-fiber 42 in accordance with the present invention is providing a coupler that could affect the dissipation or attenuation of the above-discussed "stray" radiation while still being able to cool the gain-fiber and surrounding components.

Figure 8B:
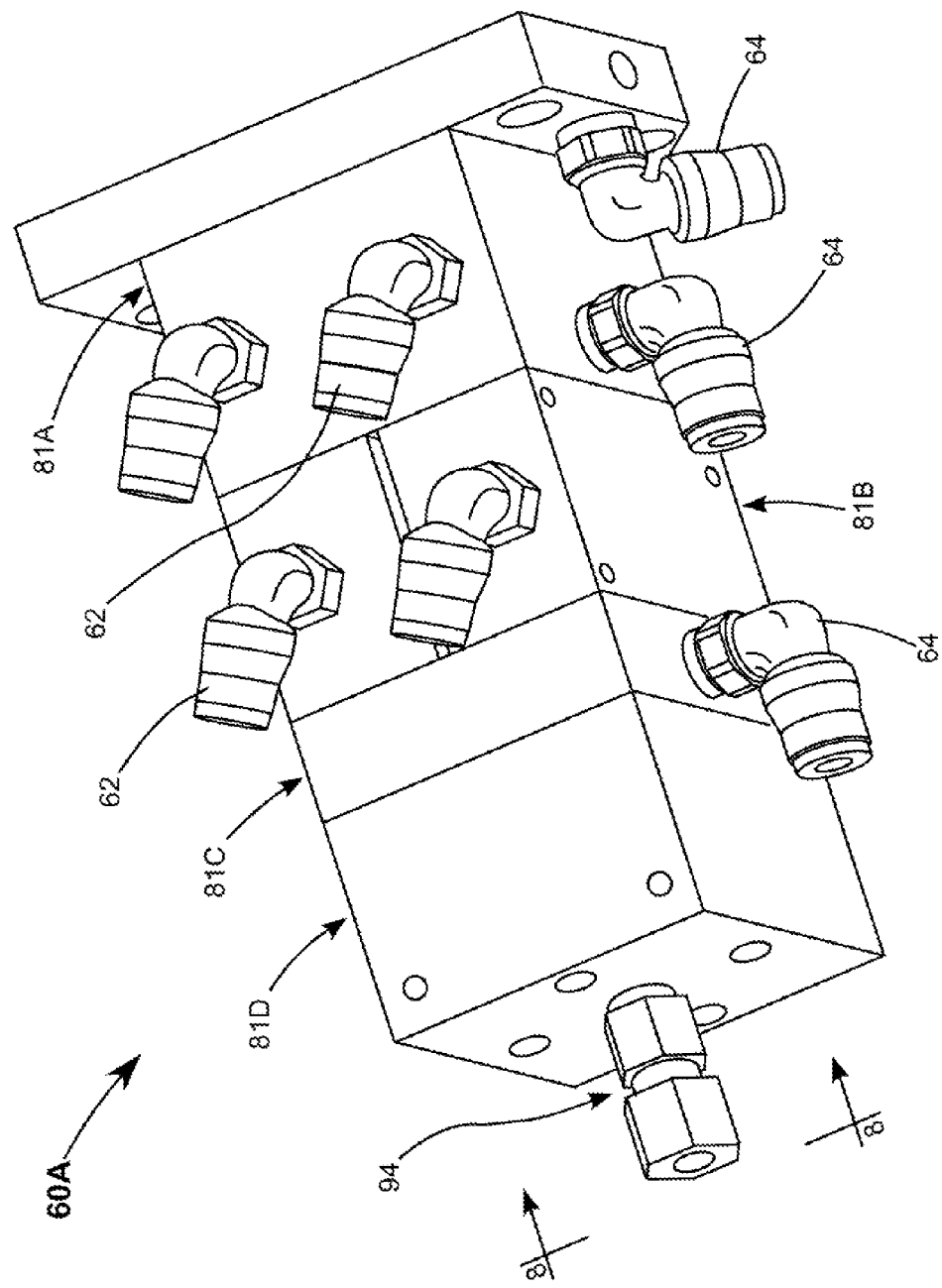
FIG. 8B is a three-dimensional view schematically illustrating the entire coupler and designating the longitudinal-section plane of FIG. 8A by arrows 8A-8A.

FIG. 8 is a longitudinal cross-section view schematically illustrating a preferred arrangement 60A of coupler 60 of the laser of FIG. 3. FIG. 8A schematically illustrates complete internal elements of the coupler. FIG. 8B is a three-dimensional view schematically depicting the entire coupler. Coupler 60A has a body formed from four sections 81A, 81B, 81C, and 81D, preferably made from copper (Cu). Sections 81A and 81B are fluid-cooled (water-cooled) by flowing a coolant through channels 82 therein. In sections 81A, B, and C, gain-fiber 42 has primary and secondary polymer coatings 36 and 38 (see FIG. 4) stripped off. In section 81A, the stripped gain-fiber is free standing in a cylindrical channel 83 having a diameter between about 3-times and 10-times bigger than the OD of the stripped gain-fiber to allow air circulation. The wall of the channel is textured to increase the surface area of the wall. This can be done conveniently by means of a screw-thread as schematically illustrated.

In section 81A, pump-radiation that misses end 42B of the gain-fiber, and pump-radiation escaping the fiber after a very short propagation length is absorbed in the textured wall of channel 83, and any heat generated as a result of the absorption is conducted away from the channel. Heat generated in the fiber through less-than-100% conversion of pump radiation to laser radiation is carried away by flowing air through channel 83 from an inlet aperture 84.

In section 81B, mode-stripping of most of radiation propagating in second cladding 34 takes place. Here the "mode-stripper" is a cylindrical copper element 85 made from two parts 85A and 85B, between which the stripped gain-fiber is held. The element is a tight fit in a channel 86 in section 81B to permit good thermal conduction between the element and the water-cooled section. The assembled element is sectioned by a plurality of circular cut-outs 87 leaving "fins" 87A therebetween. The cut-outs provide a large surface area for absorbing stripped cladding modes, and the sectioning of the copper element provides relief from thermal expansion mismatch between the copper and the fiber. Because of a difficulty with forming narrow semicircular grooves of the correct radius in the fins 87A in which the fiber is to be held, it has been found useful to actually bond the fiber to the fins with a thermally conductive adhesive. Thermally conductive epoxy and metallic indium have been found to be useful as such adhesives.

FIG. 8C schematically illustrates an alternate arrangement 181B of section 81B of FIG. 8. Here, the finned mode-stripper 85 of section 81B is replaced by a mode-stripper 185. The finned portion of mode-stripper 85 is replaced by a copper cylinder 182. Cylinder 82 has an aperture 178 extending therethrough having a diameter sufficient to provide clearance for fiber 42. Preferably the diameter of the aperture is about three-times the diameter of fiber 42. Clamped against each end of cylinder by annular end flanges 186 and 189 are crossed pairs 184 of optical fibers. Fiber 42 passes through the fiber square defined by crossed fiber pairs, such that the fiber pairs provide support for fiber at each end of cylinder 182.

Detail of one crossed-fiber-pair support 148 is depicted in FIG. 8D. This shows four fibers 183 arranged as two pairs thereof crossed perpendicular to each other, with gain-fiber trapped where the fiber pairs overlap. Needless to say, fibers 183 can be core-less. The fibers can also be of a diameter selected to provide optimum support and resilience. This mode-stripper arrangement is simpler to construct than the finned arrangement of mode-stripper 85. Even in the relatively short lengths involved, the crossed fibers are sufficiently resilient to accommodate thermal without damage to fiber 42.

Referring again to FIG. 8, in section 81D, the fiber includes the primary and secondary polymer layers, into which any radiation not stripped from the second cladding in section 81B can leak. For this reason, this part of the gain-fiber is cooled by conduction into a cooling-block 88 formed from two parts 88A and 88B. The fiber fits tightly between parts 88A and 88B but the complete block is smaller than a cut-out 89 made to receive the cooling-block leaving a space 90 between the cooling-block and cut-out 89.

Section 81C of the coupler is a transition section between sections 81B and 81D and includes a gallery 91 into which air can be forced via an aperture 92. Air is forced into gallery 91 and cools the free-standing part of the stripped fiber between mode-stripper element 85 and cooling block 88. The air flows from gallery 91 through space 90 between block 88 and cut-out 89 and cools the free-standing portion of the gain-fiber in an exit-sleeve 94 of the coupler. Immediately on exiting sleeve 94, fiber 42 is supported on a grooved chill-plate 96 for the entire length of the fiber.

In initial tests of an example of the inventive fiber-laser it was found to exhibit unstable output of an undesirable pulsed form when average output power was increased above about 50% of the design maximum, in this case above 500 W in an example having a design peak reliable operating power of 1 kW. This pulsing is schematically depicted graphically in FIG. 9. Here, output is in the form of very short, pulses occurring at more or less regular intervals with noisy CW operation at nominal average power in between pulses. The pulses typically have a peak-power between about two and twenty times the nominal average power. The pulse repetition interval is equal to the laser cavity round-trip time or a harmonic thereof. It is believed without being limited to a particular theory that this pulsing behavior of the output is due to resonant enhancement of stimulated Raman scattering (SRS).

Stimulated Raman Scattering is known to be a limiting factor in power-scaling of rare-earth doped fiber-lasers because it causes a parametric broadening of the laser spectrum out of the useful wavelength (gain-bandwidth) range and causing temporal instabilities due to the fast response to energizing compared that of a rare-earth transition. In the 1000-nm spectral region, the Raman gain peaks at a Stokes-shifted wavelength approximately 60 nm (3 THz) longer than the signal (lasing) wavelength. However, some Raman gain is present at all wavelengths between the signal wavelength and peak Raman-gain wavelength.

In fiber amplifiers, the power loss to Raman-gain grows from noise, and requires the Raman gain to reach a very high value of around 60 dB before significant power transfer can occur. The situation is similar in fiber-laser resonators employing Bragg gratings of very limited bandwidth as reflectors.

In the inventive laser, a broad band dielectric mirror is used for the highly reflective (HR) minor, and an uncoated end-face of the gain-fiber is used for the pump input and laser output coupling mirror. In the laser that provided the output of FIG. 9, the HR mirror had a bandwidth broad enough to form a resonant cavity at the Raman gain wavelengths in addition to a resonant cavity at the lasing wavelength. It was postulated that this "Raman-resonator" led to supplementation of the rare-earth (Yb in this example) gain by Raman gain (at low levels) which is a major contributor to spectral broadening. Measurements indicated that when the spectral-width of the output approached the 60 nm Stokes-shift wavelength, the pulsing effect of FIG. 9 occurred. It is believed that the pulsing behavior is initiated by small amplitude fluctuations due to longitudinal mode beating with a resonantly-enhanced Raman gain in the pulsed regime allowing for more efficient energy extraction from the Yb gain-medium.

Figure 9:
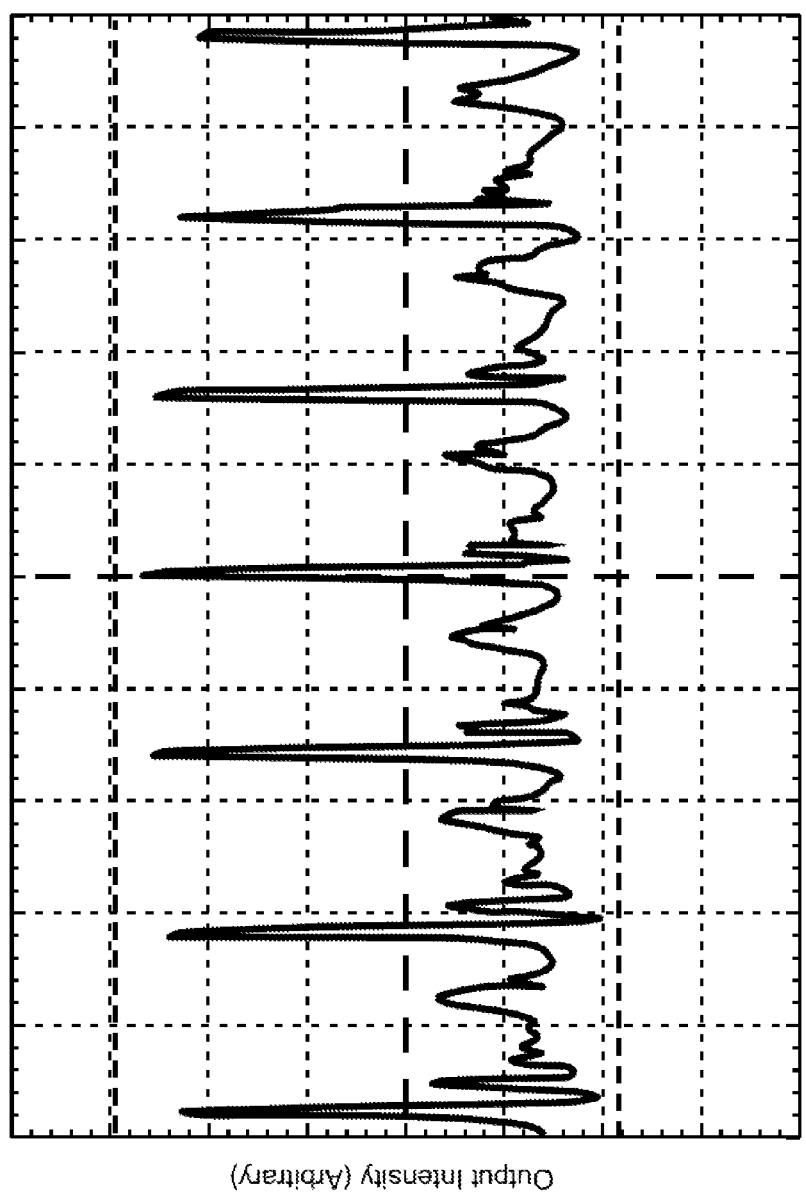
FIG. 9 is a reproduction of an oscilloscope trace schematically depicting output power as a function of time in an example of the laser of FIG. 3 with resonance-enhanced Raman gain causing unwanted pulsed behavior of the output.

The pulsing problem was substantially mitigated by replacing the original highly reflective minor in the example of FIG. 9 with new mirror having a transmission-edge at a shorter wavelength. Transmission as a function of wavelength transmission spectra) for the original and new mirrors is schematically graphically depicted in FIG. 10. The spectrum of the original minor is depicted by a dashed curve and the spectrum of the new mirror is depicted by a solid curve. Those skilled in the art will recognize that as these are multilayer dielectric minors the reflection will be essentially 100% minus the indicated transmission. It can be seen that the original minor is highly reflective in the Raman gain band which lies between wavelengths of about 1140 nm and about 1180 nm. The new mirror is still highly reflective over most of the Yb gain-band between about 1080 nm and 1120 nm but is highly transmissive for Raman gain band 1140-1180 nm. Both mirrors are highly reflective at the pump-radiation wavelength of about 980 nm.

The new mirror design was refined by experimentally determining the natural wavelength of operation of the experimental inventive fiber-laser in the threshold regime using the original minor. This is the longest wavelength for which the gain exceeds the loss of the cavity and is determined, inter alia, by the length of the laser cavity and the doping concentration in the fiber core. The new minor is essentially a long-wavelength pass (long-pass) filter having cutoff wavelength (at reflection or transmission equal to 50%) within 10 nm of the experimentally determined natural lasing wavelength.

Figure 11:
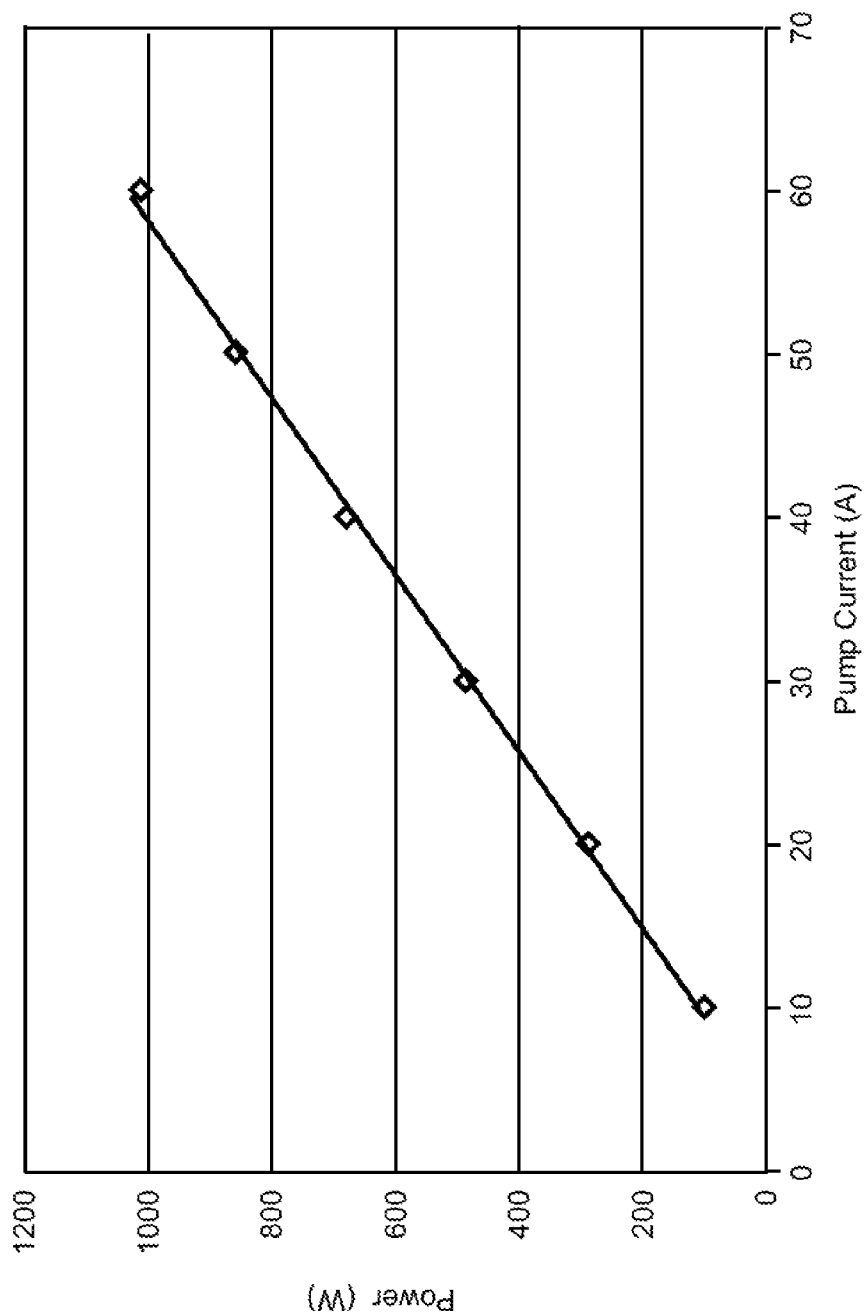
FIG. 11 is a graph schematically illustrating measured output power as a function of diode-laser pump current in an example of the laser of FIG. 3 using the Raman-transmitting minor of FIG. 10.

FIG. 11 is a graph schematically illustrating measured output-power as a function of pump-current, i.e., current delivered to the diode-laser bar-stacks, for the example of the inventive laser with the original mirror replaced by the new, Raman-transmitting, mirror. Power was measured at six different current-settings with the power measurements being a close fit to a linear plot. It was possible to increase power up to a target maximum power of 1.0 kW without the onset of pulsing.

Figure 12:
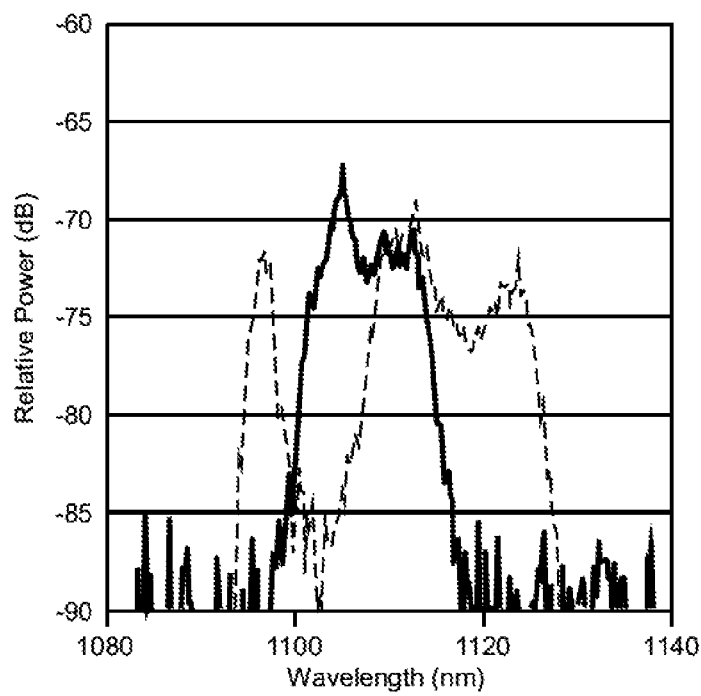
FIG. 12 is a graph schematically illustrating measured power output as a function of wavelength for an example of the laser of FIG. 3 using the mirrors of FIG. 10.

FIG. 12 is a graph schematically illustrating measured output power (log scale) as a function of wavelength for the example of the inventive laser with the original mirror (fine dashed curve) and the new Raman-transmitting mirror (bold solid curve). The bandwidth narrowing due to the Raman-gain suppression is clearly evident. Peak-emission with the Raman-transmitting mirror is at a wavelength about 10 nm shorter than with the original broad-band mirror.

Figure 10:
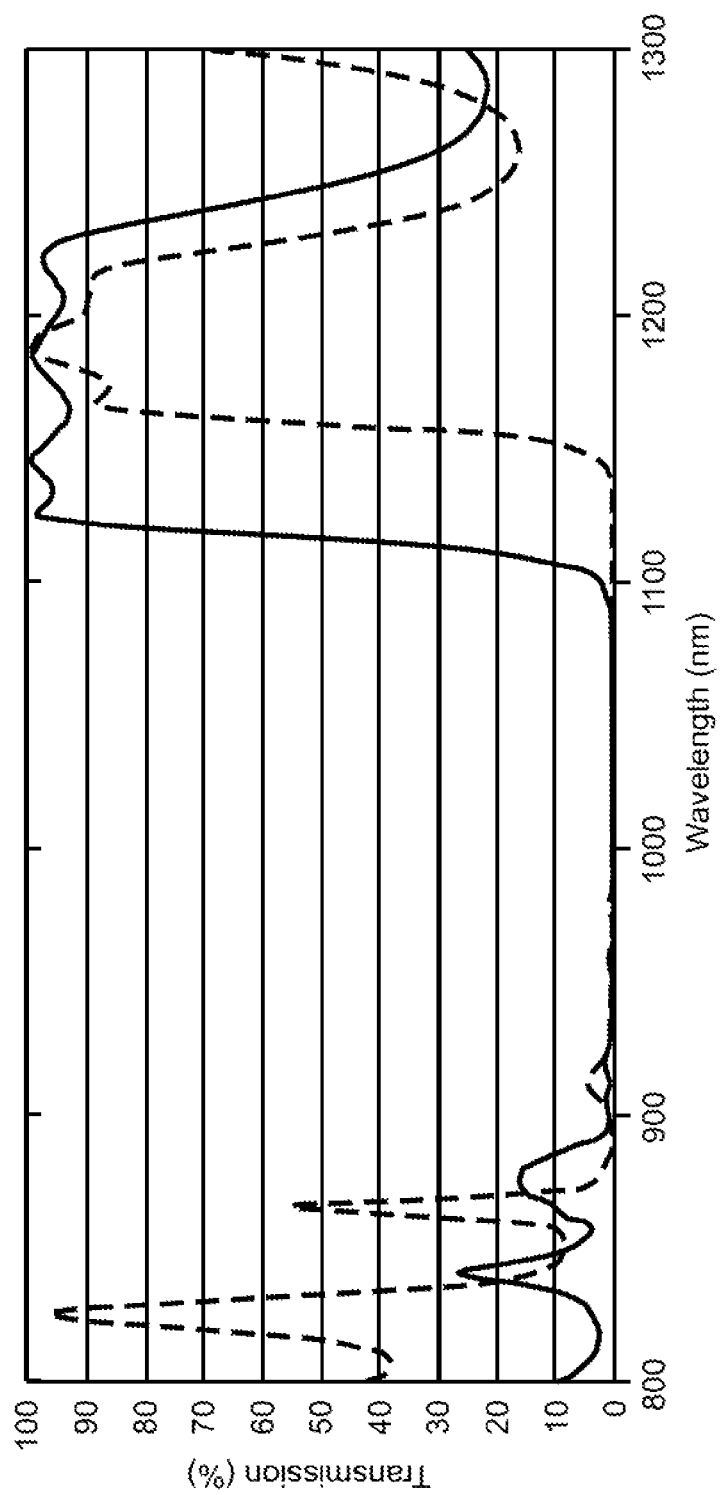
FIG. 10 is a graph schematically illustrating measured transmission spectra of two different highly reflective mirrors used in an experimental example of a laser in accordance with the embodiment of the present invention schematically depicted in FIG. 3 with one of the mirrors being reflective in the Raman-gain region and which produced the result of FIG. 9, and the other being highly transmissive in the Raman-gain region.
Figure 13:
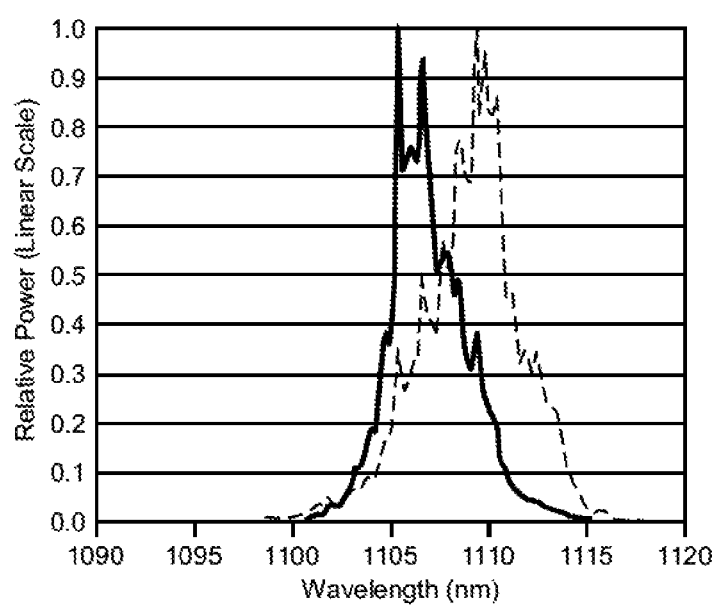
FIG. 13 is a graph schematically illustrating measured power output as a function of wavelength for an example of the laser of FIG. 3 using the Raman-transmitting minor of FIG. 10 for two different proximity-coupling distances of the minor from the end of the gain-fiber.

FIG. 13 is a graph schematically illustrating measured power-output as a function of wavelength for an example of the laser of FIG. 3 using the Raman-transmitting mirror of FIG. 10 for two different spacing distances S of the mirror from the end of the gain-fiber (see FIG. 3A). The bold solid curve depicts a case where the spacing S is near a maximum of about 100 μm. The fine dashed curve depicts a case where the spacing is essentially in contact with the end of the gain-fiber. It can be seen that increasing the spacing (in this case at least) from a closest spacing to a maximum practical spacing provides narrowing of the spectral bandwidth of the laser output with shifting of the lasing wavelength to shorter wavelengths.

It is believed that varying this spacing can be used to supplement Raman transmission by the mirror in increasing the threshold for the onset of unwanted pulsed output. It is possible that mirrors having a shorter long-wavelength transmission edge than Raman-transmitting mirror discussed above may provide quieter CW laser operation with a higher-power threshold for pulsing, and that this can be "fine-tuned" by varying the spacing of the mirror from the end of the gain fiber. This can be determined by relatively simple experiments.

Figure 14:
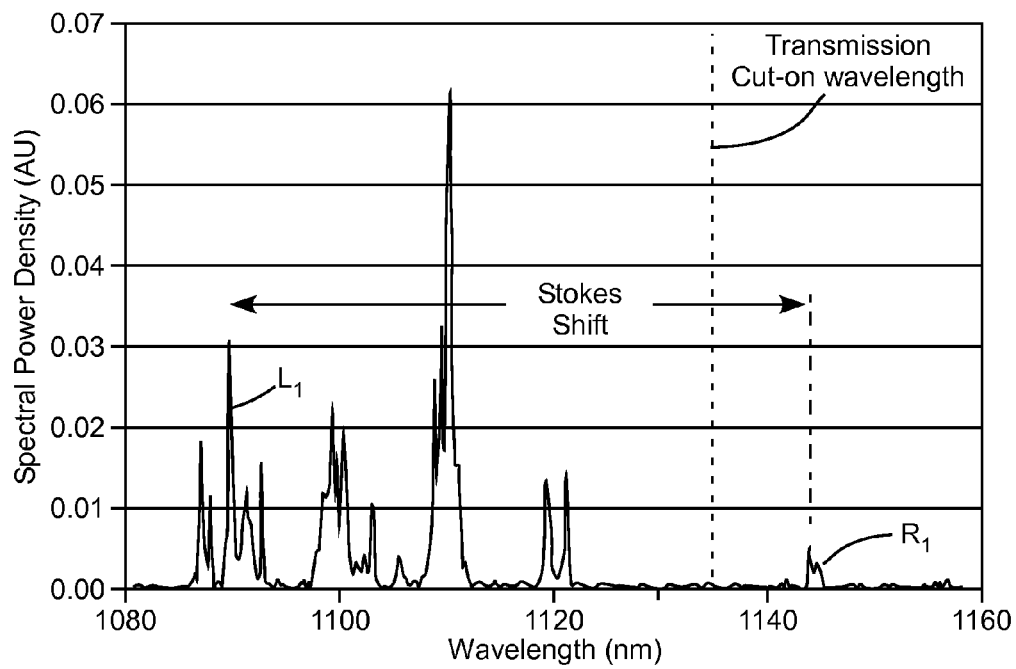
FIG. 14 is a graph schematically illustrating a lasing spectrum at pulsing threshold in a fiber laser similar to the inventive fiber laser but terminated by a mirror having a transmission cut on almost a Stokes shift away from a natural lasing wavelength.

FIG. 14 is a graph schematically illustrating a lasing (oscillation) spectrum at pulsing threshold in a fiber laser similar to the inventive fiber laser but terminated by a mirror having a transmission cut-on wavelength almost a Stokes shift away from a natural lasing wavelength. Lasing begins at a natural lasing wavelength of about 1090 nm as indicated by spectral peak $L_1$. As laser power builds up in the laser resonator the lasing spectrum broadens into a region at wavelengths longer than about 1100 nm where the Raman gain makes a significant contribution to overall gain. This occurs because the cut-on wavelength of the terminating mirror is at about 1135 nm almost a Stokes shift from peak $L_1$. The Stokes shift from the wavelength of peak $L_1$ is evidenced by the small spectral peak $R_1$ at a wavelength of about 1145 nm. In order to minimize collateral generation of stimulated Raman scattering it is preferred that the transmission cut on of the highly reflective mirror in a laser in accordance with the present invention is within between about 20% and 80% of a Stokes shift of the lowest-wavelength peak in the oscillation spectrum with less than 50% being more preferred.

Figure 15:
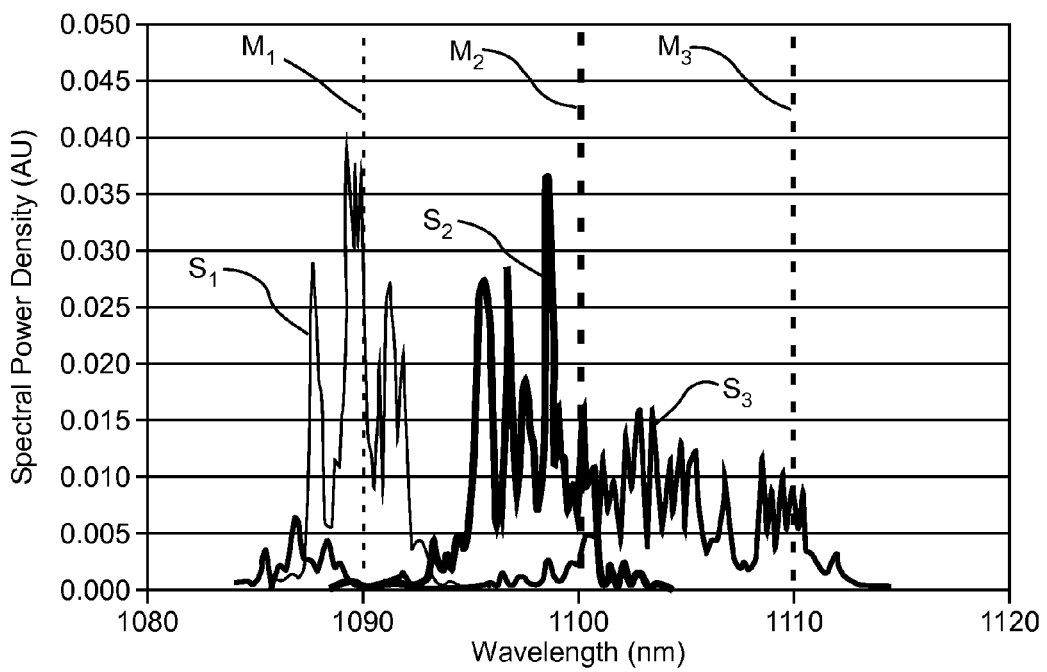
FIG. 15 is a graph schematically illustrating sub-pulsing threshold spectra in the inventive fiber laser for three different terminating mirrors each having a transmission cut-on wavelength significantly less than a Stokes shift from a natural lasing wavelength.

FIG. 15 is a graph schematically illustrating sub-pulsing threshold spectra in the inventive fiber laser for three different terminating mirrors each having a transmission cut-on wavelength significantly less than a Stokes shift from a natural lasing wavelength. The cut-on wavelengths are indicated by dashed lines $M_1$, $M_2$, and $M_3$, with corresponding lasing spectra $S_1$, $S_2$, and $S_3$. It can be seen that the lasing spectrum is broader the longer the cut-on wavelength of the mirror. The cut-on wavelength of minor M2 here is about optimum, with most of the lasing spectrum being at wavelengths shorter than cut-on wavelength where minor reflectivity is high. If the minor cut-on wavelength is moved to too short a wavelength such as in the case of minor $M_1$, the pulsing threshold is raised but about half of the lasing spectrum is at wavelengths longer than the cut-on wavelength and leaks out of the resonator through the mirror.

Recapitulating here, the CW fiber-laser of the present invention uses a design approach different from that currently favored by the fiber-laser community. The design approach is motivated by factors including improved thermal management in the gain-fiber, single step aggregation of diode-laser bars to provide pump-radiation, stable multi-mode operation, high conversion efficiency and power scalability. The fiber-laser includes only a gain-fiber end-pumped via a water cooled active-fiber connector, with a conditioned beam from one or more fast-axis diode-laser bar-stacks. The fiber-laser cavity simply consists of multilayer highly reflective (HR) multilayer dielectric minor proximity coupled to one end of the active fiber and a 4% reflection from the uncoated opposite end of the fiber.

The HR minor is highly reflective at the natural wavelength of operation (in the presence of broadband reflectors) and for the pump-radiation wavelength (to provide double-pass pump absorption). Crucially, the mirror is also highly transmitting at wavelengths longer than the natural wavelength of operation. This suppresses excessive bandwidth growth and associated temporal instabilities related to stimulated Raman scattering.

The laser architecture is notably splice free, thereby minimizing transverse mode coupling, maximizing efficiency and reducing the number of points of potential package-related failure. In contrast to prior-art fiber-lasers fabricated with traditional large-mode-area (LMA) fibers, the fiber is not coiled tightly to induce higher order mode leakage for providing differential modal gain. Indeed the inventive fiber-laser design is arranged to minimize differential modal gain, which minimization is a key to obtaining stable multimode operation at all power levels. Examples of the inventive laser have provided a stable multi-mode beam of radiation having a power greater than 1 kW with an $M^2$ of 2.72 (directly from the gain-fiber) with a beam parameter product (BPP) in the far-field of about 2.5 millimeter.milliradians (mm.mRad).

In the description of the inventive fiber-laser presented above, it is noted that increased pump-power may be provided from diode-laser bar-stacks by spectral combination of radiation at two possible absorption wavelengths, 976 nm and 915 nm of the ytterbium-doped gain-fiber. Spectral combination of pump wavelengths for power-scaling fiber-lasers is well known in the art.

Figure 16:
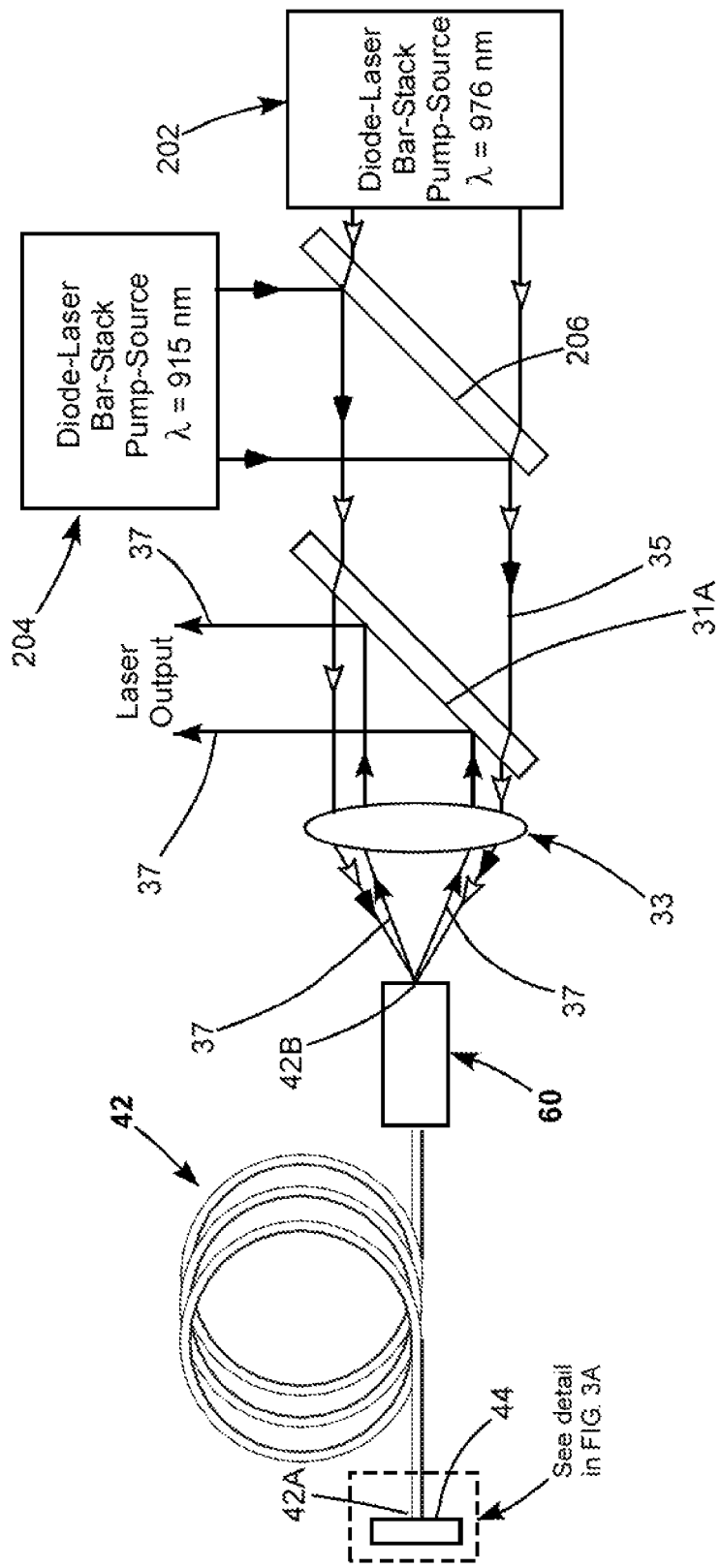
FIG. 16 schematically illustrates another basic embodiment of a fiber-laser in accordance with the present invention, similar to the laser of FIG. 3 but wherein pump-power is supplied by one diode-laser bar-stack providing radiation having a wavelength of about 976 nm and another diode-laser bar-stack providing having a wavelength of about 915 nm with radiation from the bar-stacks combined on a common path be a dichroic minor.

FIG. 16 schematically illustrates one preferred embodiment 200 of a fiber-laser in accordance with the present invention, including spectral (wavelength) scaling of pump-power. Laser 200 is similar to laser 40 of FIG. 3 with exceptions as follows.

Diode-laser bar-stack source 46 is replaced with a diode-laser bar-stack 202 providing radiation at a wavelength of about 976 nm (open arrowheads), and a diode-laser bar-stack 204 providing radiation at a wavelength of about 915 nm (closed arrowheads). Beams having the two different wavelengths are combined on a common path by a dichroic filter (mirror or beam-combiner) 206 having high reflection at 915 nm and high transmission at 976 nm. Dichroic minor 31 of laser 40 is replaced in laser 200 by a dichroic mirror 31A having high transmission at the 915 nm and 976 nm wavelengths and high reflection for the laser-output wavelengths discussed above. The combined 915-nm and 976-nm beams are focused by lens 33 into gain-fiber 42.

Figure 17:
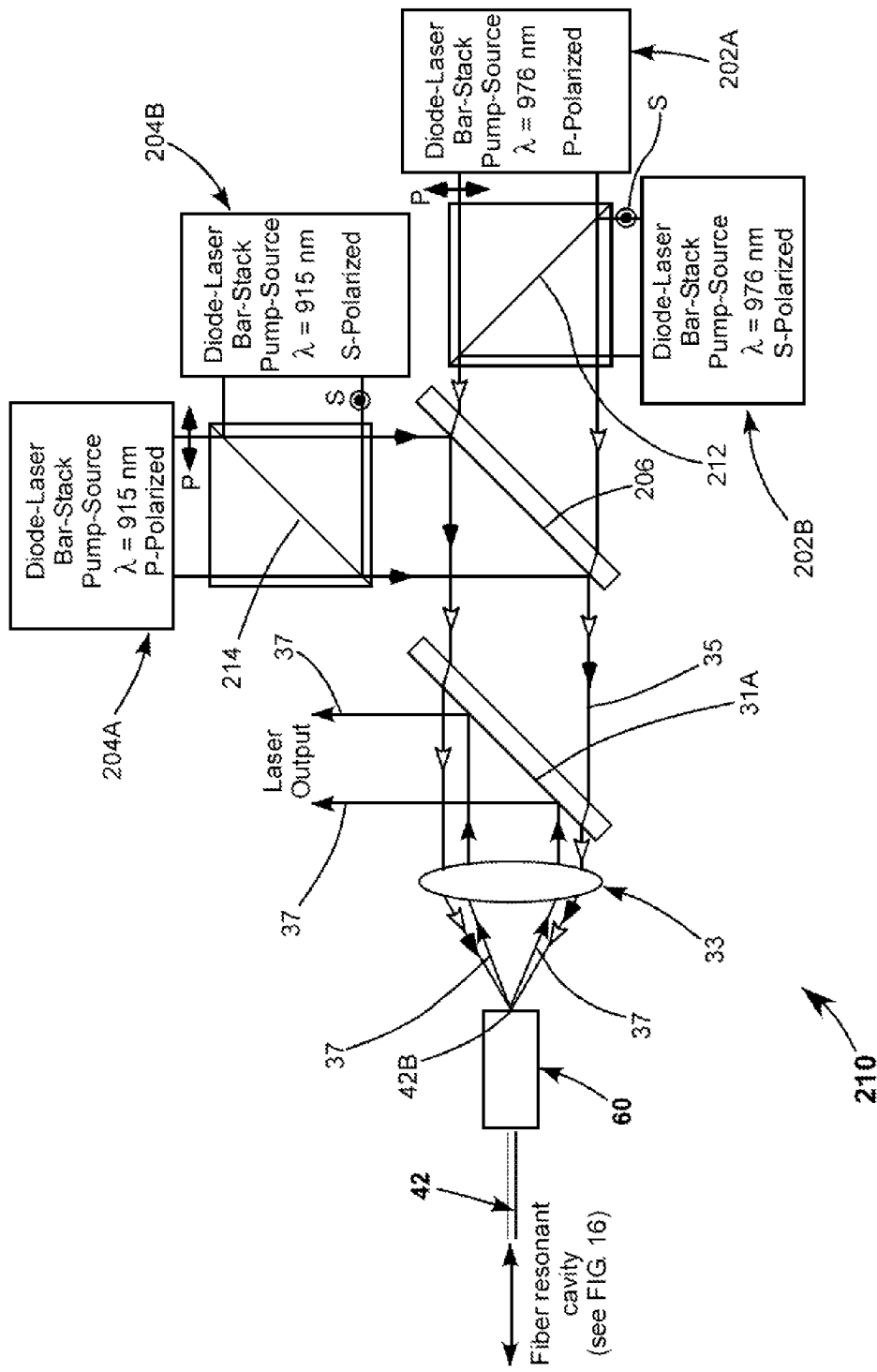
FIG. 17 schematically illustrates yet another basic embodiment of a fiber-laser in accordance with the present invention, similar to the laser of FIG. 16 but wherein there are two diode-laser bar-stacks providing 976-nm radiation and two diode-laser bar-stacks providing 915-nm radiation with polarization combination of the 915-nm and 976-nm radiations ahead of the wavelength combination by the dichroic-mirror.

FIG. 17 schematically illustrates another preferred embodiment 210 of a fiber-laser in accordance with present invention including spectral (wavelength) scaling of pump-power. Laser 210 is similar to laser 200 of FIG. 16 with an exception that 976-nm radiation is supplied by two-diode-laser bar-stacks 202A and 202B, and 915-nm radiation is supplied by two-diode-laser bar-stacks 204A and 204B. The diode-laser bar-stacks with the same output wavelength are oriented with respect to each other such that the polarization-orientation of the radiation from one is at 90° to the polarization-orientation of radiation from the other. The orthogonally polarized 915-nm radiations are combined by a polarization-selective beam-combiner 214. The orthogonally polarized 976-nm radiations are combined by a polarizing beam-combiner 212. In each case, the orthogonally oriented polarization-planes are designated by arrows P and arrowheads S, here, referring to the orientation of the polarization-planes with respect to the corresponding polarization-selective beam combiner.

Figure 18:
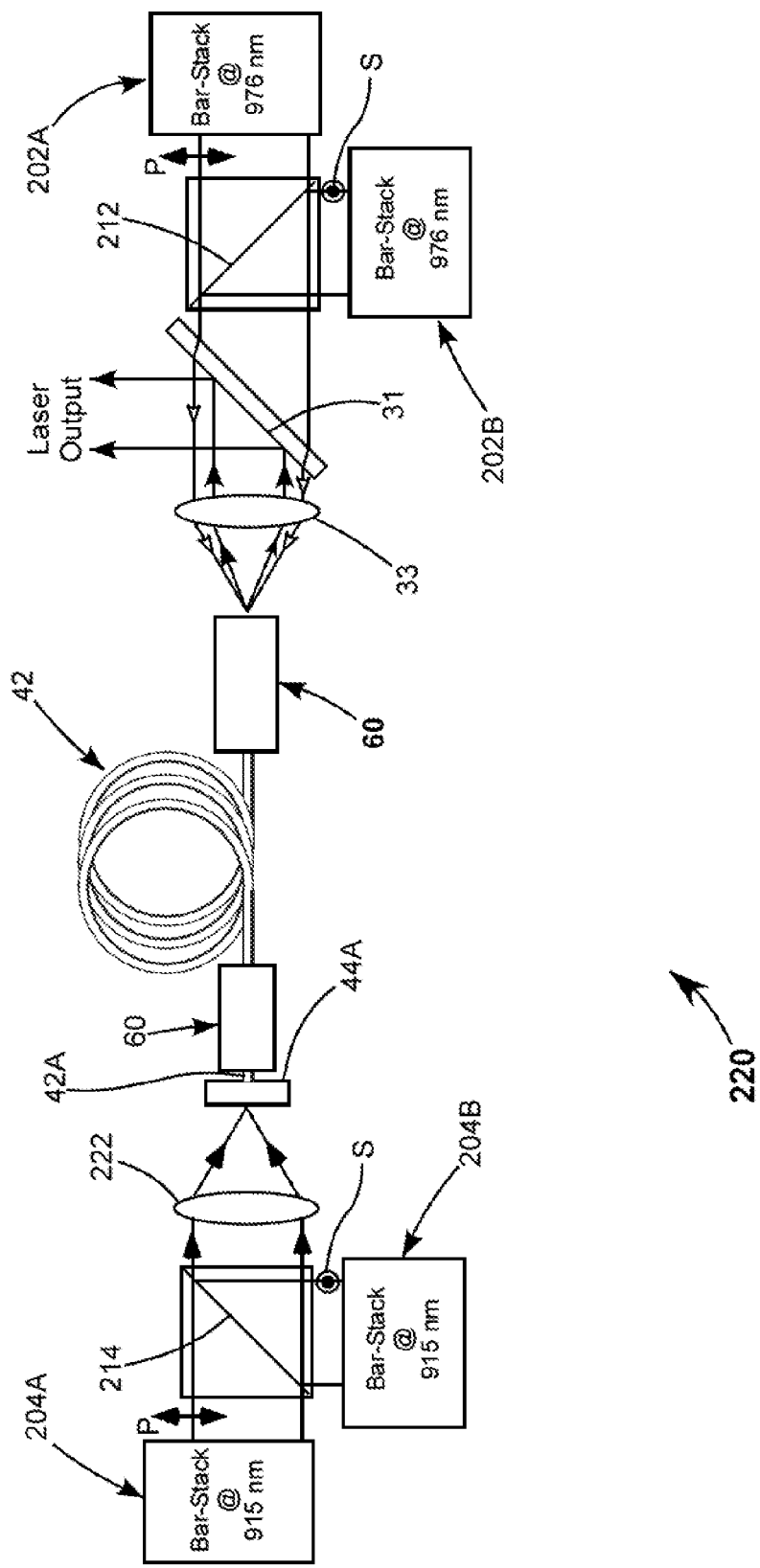
FIG. 18 schematically illustrates still another basic embodiment of a fiber-laser in accordance with the present invention, similar to the laser of FIG. 17 but wherein the polarization-combined radiation from the 976-nm diode-laser bar-stacks is directed into one end of the gain-fiber and polarization-combined radiation from the 915-nm diode-laser bar-stacks is directed into the opposite end of the gain-fiber.

FIG. 18 schematically illustrates still another basic embodiment 220 of a fiber-laser in accordance with the present invention, similar to the laser 210 of FIG. 17 but wherein the polarization-combined radiation from 976-nm diode-laser bar-stacks 202A and 202B is directed into one end of the gain-fiber, and polarization-combined radiation from 915-nm diode-laser bar-stacks 204A and 204B is directed into the opposite end of the gain-fiber. Dichroic minor 206 of laser 210 is no longer required. Dichroic minor 31 replaces dichroic mirror 31A.

A lens 222 focuses the 915 nm radiation into end 42A of gain-fiber 42. End minor 44A has the reflection and transmission specifications discussed in detail above, and, additionally, is transparent at about 915 nm to allow the passage of the 915-nm pump radiation. A coupler 60 on fiber-end 42A may or may not be required depending pump-power delivered. In this regard, it should be noted that pumping ytterbium-doped fiber 42 with 915-nm radiation is less efficient than pumping with 976-nm radiation due to a high quantum defect of the 915-nm radiation. Because of this it may prudent to either operate both 915-nm bar-stacks at lower power than the 976-nm bar-stacks, or to simply dispense with any one of the 915-nm bar-stacks and the polarizing selective beam-combiner.

Figure 19:
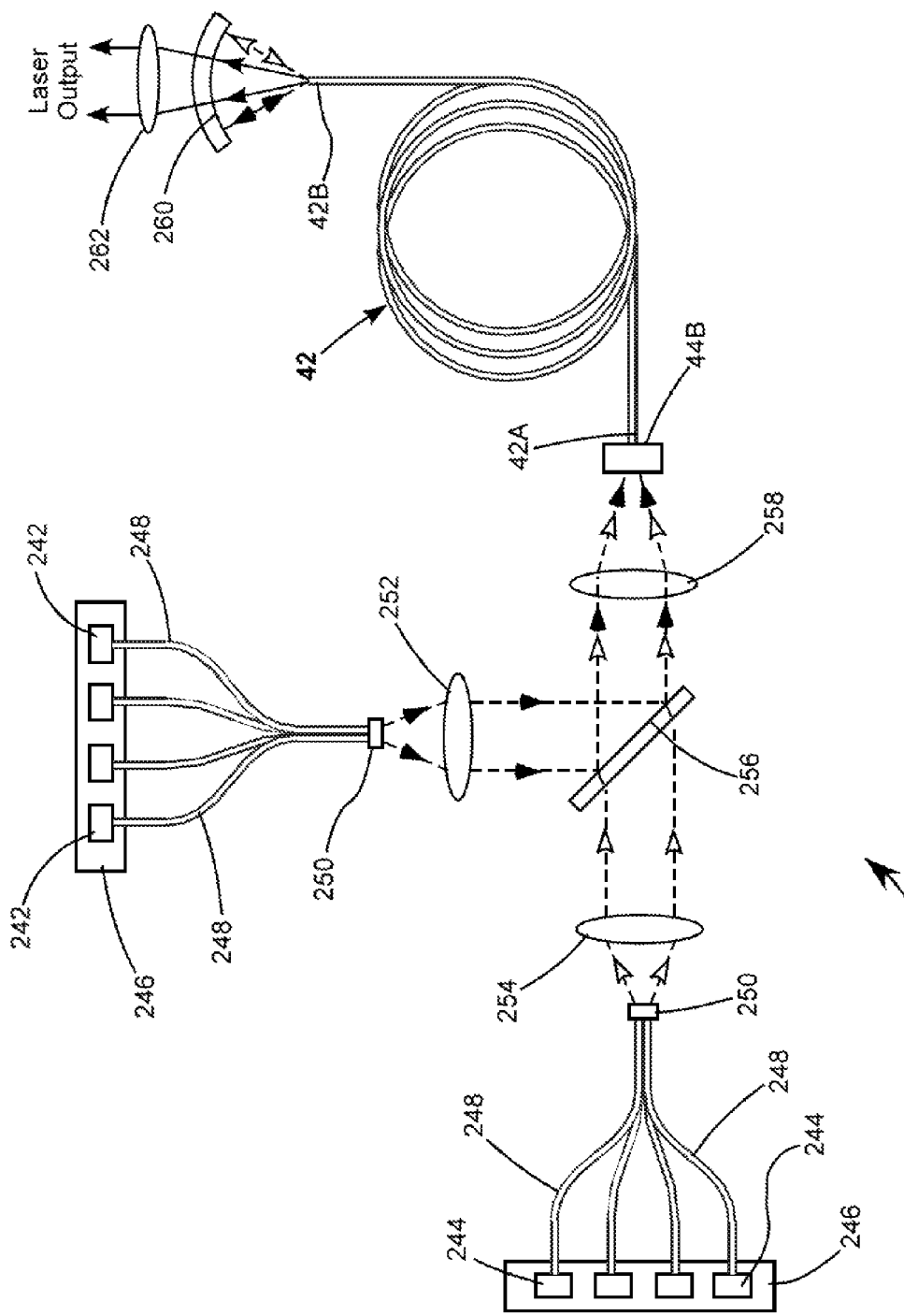
FIG. 19 schematically illustrates a preferred embodiment of a diode-laser fiber-array-package (FAP) pumped fiber laser in accordance with the present invention, with pump-radiation supplied by a plurality of FAPs delivering 915-nm radiation and a plurality of FAPs delivering 976-nm radiation, and with the 915-nm and 976-nm radiations being combined by a dichroic beam combiner before being focused into one end of a gain-fiber of the fiber laser.

FIG. 19 schematically illustrates a preferred embodiment 240 of a diode-laser fiber-array-package (FAP) pumped fiber laser in accordance with the present invention. In laser 240, pump-radiation is supplied by a plurality of fiber-array-packages (FAPs) 242, each delivering 915-nm radiation, and a plurality of FAPs 244, each delivering 976-nm radiation. Pump radiation is designated here by dashed lines.

As is known in the art, a FAP includes a diode-laser bar having a plurality of individual emitters therein. Radiation-beams from the plurality of emitters are collimated by a cylindrical fast-axis collimating lens (not shown) and then coupled into corresponding plurality of optical fibers, which are formed into a fiber-bundle. Fiber-bundles are designated by reference numeral 248 in FIG. 19. The fiber bundles themselves are bundled and retained by fiber holders 250.

The radiation from the 915-nm FAPs is collimated by a collimating lens 252. The radiation from the 976-nm FAPs is collimated by a collimating lens 254. The collimated 915-nm and 976-nm radiations are combined by a dichroic beam-combiner 256. The combined radiations are then focused by a lens 258 through and end-reflector 44B into end 42A of gain-fiber 42. Reflector 44B is preferably proximity coupled to fiber 42 as described above for minor 44 in laser 40 of FIG. 3. The reflector preferably has the same Raman-suppressing reflection and transmission specification as described for mirror 44, but must additionally be highly transparent for the 915-nm and 976-nm pump radiations.

It is contemplated that all of the pump radiation will not be absorbed in gain-fiber 42. Un-absorbed pump-radiation escapes end 42B of fiber 42 and is reflected back into the fiber by a concave mirror 260. Minor 260 is highly reflective for the 915-nm and 976-nm pump radiations and highly transmissive for the laser-radiation wavelengths. The laser output-radiation, here designated by solid lines, is transmitted through mirror 260 is collimated by a lens 262.

In one contemplated example of laser 240, each FAP has 19 emitters 90 mm-wide. Individual fibers of bundles 248 thereof are multimode fibers with a core-diameter of 125 μm. Wavelength locking by external feedback is not contemplated, albeit not precluded. The individual FAPS can be mounted on bases 246 with sufficient spacing to avoid temperature-induced wavelength changes.

Assuming 90% coupling efficiency, this arrangement provides a wavelength-combined pump-power of 640 W. Fiber 42 is assumed to have specifications as described above and a length of 600 cm. A laser-radiation output-power of 470 W is assumed, based on an assumed 75% optical conversion efficiency. These figures, of course, should not be considered as limiting the present invention.

Figure 20:
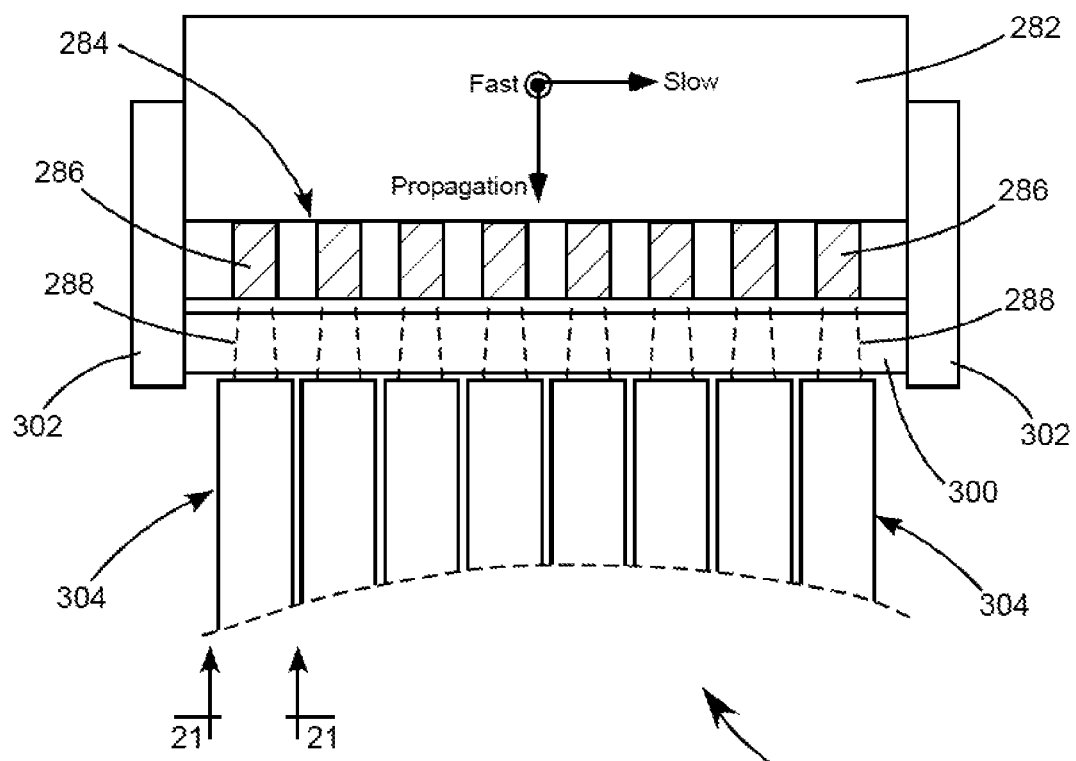
FIG. 20 schematically illustrates a diode-laser bar package in accordance with the present invention for pumping a fiber-laser, the package including a diode-laser bar having a plurality of diode-laser emitters therein emitting a corresponding plurality of laser beams, a cylindrical lens for collimating the beams in the fast-axis thereof, and a corresponding plurality of rectangular-core optical fibers each arranged to receive and transport one of the laser beams.

FIG. 20 schematically illustrates a diode-laser bar package 280 in accordance with the present invention for pumping a fiber-laser such as the laser of FIG. 19. The package includes a sub-mount 282 supporting a diode-laser bar 284, here having eight diode-laser emitters therein. As is well known in the art, such emitters have a rectangular aperture (not shown) with the width of the aperture typically being greater than the height. The emitting apertures are spaced apart in the slow-axis direction in the diode-laser bar widths aligned in the slow-axis. The emitted radiation is plane-polarized, and the polarization-orientation thereof may be aligned with the fast axis or the slow axis depending on materials and growth conditions of the diode-laser bar. Radiation-beams 288 from the diode-laser emitters are collimated in the fast-axis by a cylindrical lens 300, here, supported on the sub-mount by supports 302. Each of the eight fast-axis collimated beams is received by the proximal end of a corresponding one of eight rectangular-core fibers 304.

Figure 21:
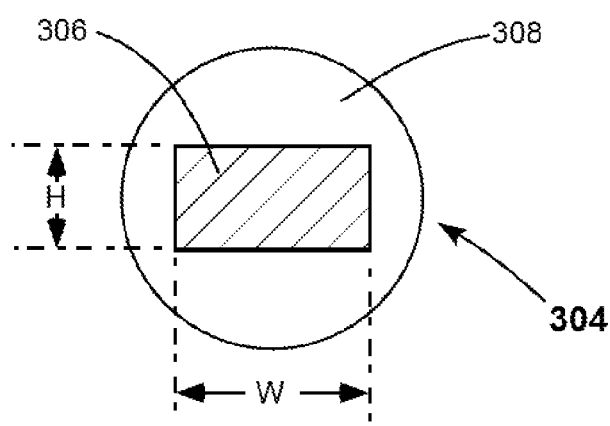
FIG. 21 is a cross-section view seen generally in the direction 21-21 of FIG. 20 schematically illustrating details of the rectangular core and round cladding of a fiber in the package of FIG. 20 the core having ratio of width-to-height greater than 1.0.

FIG. 21 is a cross-section view seen generally in the direction 21-21 of FIG. 20 schematically illustrating details of the rectangular core and round cladding of a fiber 304. Fiber 304 has a core 306 surrounded by a round cladding 308. The cladding has a width W which in a package 280 is aligned with the slow axis of the diode-laser bar (emitters). Height H is aligned with the fast axis. The aspect ratio W/H of core 306 is preferably between about 1.5 and 10. A practical example would be an aspect ratio of between about 2 and 3. As far as absolute dimensions are concerned the core-width is select to be slightly greater than the emitter-width. The core height (fast-axis aligned) should be made as small as practically achievable since the brightness in the fast-axis is much higher than in the slow-axis.

The practically available aspect ratio is limited by the fiber-drawing process. In the fiber-drawing process, it is advantageous to have a round (or elliptical or oval) cladding since the forces of surface tension tend to round the sharp external features of the pre-form. The less distortion occurs on the outside the fiber, the less the core is distorted. It is preferable to keep the outside shape of the pre-form and fiber as close to natural as possible, to conserve the shape of the core. Aberrations of cylindrical lens 300 also limit the practical aspect ratio of the fiber core. If a simple rod lens is used, for example to limit costs, the brightness of the collimated beam in the fast-axis may be only few times that in the slow axis, such that only reduced aspect ratio is possible. A more sophisticated lens, such as a plano-convex lens, or gradient index (Doric) lens may conserve brightness better but also may be more expensive to fabricate and harder to align.

In the fiber forming process, the corners of the core should be kept as sharp as possible in order to prevent fast-axis and slow-axis intermixing. This ensures that lower-divergence of slow-axis does not impart itself on the fast-axis, and that polarization-orientation is conserved. Further, the fibers should be kept short and bent only slightly as they are routed to a plane where their outputs are combined. This, again, ensures that the fast-axis and slow axis are not intermixed and polarization-orientation is conserved.

Figure 22:
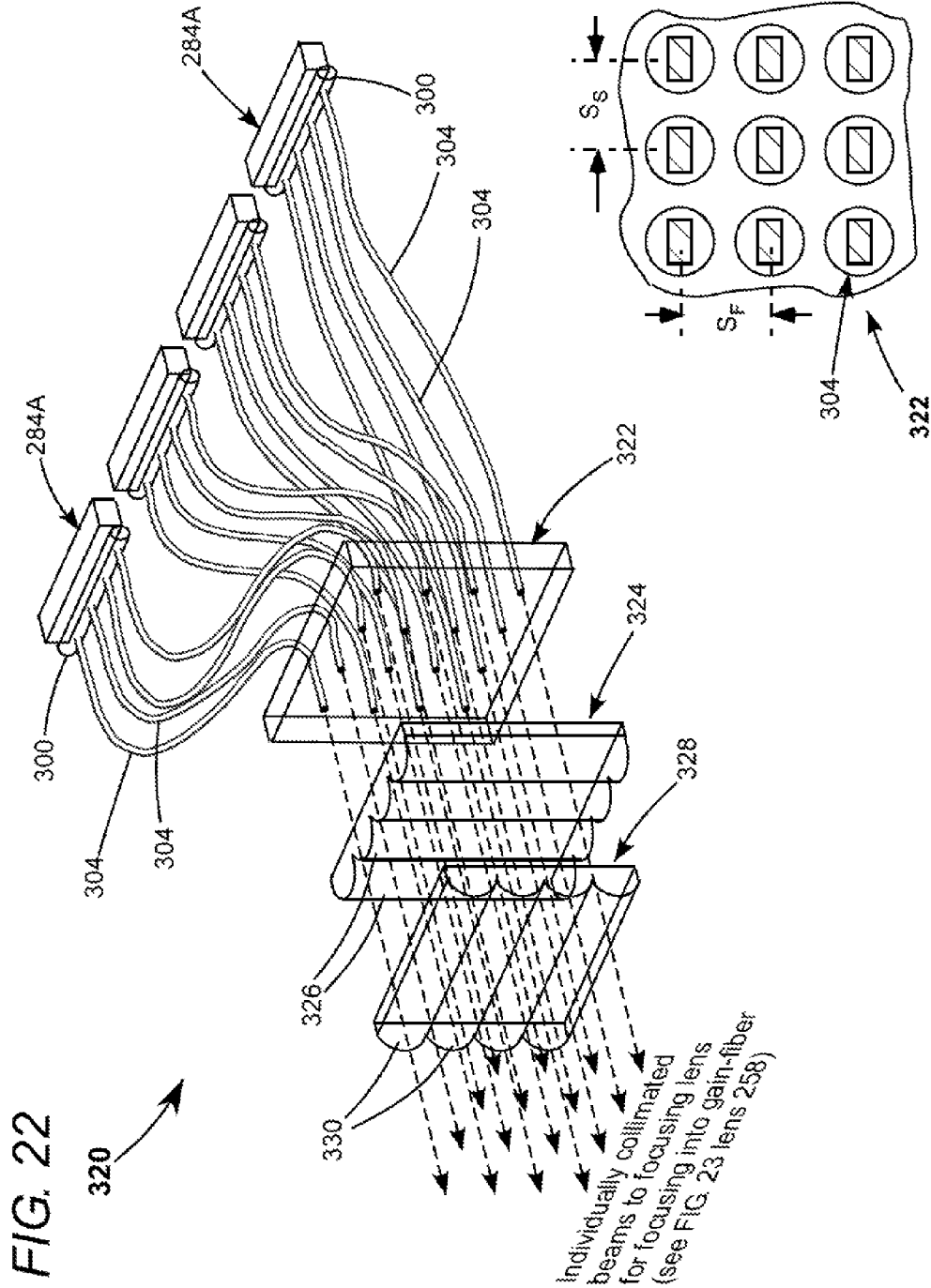
FIG. 22 is a three-dimensional view schematically illustrating one example of a pump-radiation source in accordance with the present invention including four four-emitter packages similar to the package of FIG. 20 with output ends of sixteen fibers arranged in a rectangular array delivering sixteen laser beams, the beams being individually collimated by crossed four-element cylindrical lens arrays.

FIG. 22 is a three-dimensional view schematically illustrating an example 320 of a pump-radiation source in accordance with the present invention, including four packages 284A similar to the package 284 of FIGS. 20 and 21. Each package includes a diode-laser bar. Diode-laser bars are each assumed to have only four emitters, requiring only four fibers 304 per package. This is for simplicity of illustration. In practice, a diode-laser bar may about 20 emitters, requiring a corresponding number of fibers.

The output-ends (distal ends) of fibers 304 are held in a rectangular array in a holding template 322. The template can be a thin plastic, glass or metal sheet with a lithographically defined and etched pattern of holes (not explicitly shown) that positions the fiber ends. The lithographic approach provides for accuracy and also provides that the holes can be of some cross-section shape other than round, if required. Laser machining of the holes is also an option.

FIG. 22A is a fragmentary view of the rectangular fiber-array of FIG. 22 illustrating rectangular fiber-cores aligned with both the widths and heights thereof parallel to each other for preserving the polarization-plane orientation of the diode-laser emitters in a combined beam. Here the spacing (center-to-center) between fibers in the slow-axis is $S_S$. In the fast-axis the spacing is $S_F$.

It is assumed here that beams emitted by the fibers have divergence different in the fast axis than in the slow-axis. In FIG. 22, only the central axis of each beam is depicted for simplicity of illustration. Because of the different fast-axis and slow-axis divergence, the beams are collimated by two cylindrical lens arrays with cylindrical axes of the arrays crossed. Here, a first array 324 includes four cylindrical lenses 326 aligned parallel to the fast-axis direction. The spacing between lenses 326 matches the slow-axis spacing $S_S$ of the fiber ends. A second array 328 includes four cylindrical lenses 330 aligned parallel to the slow-axis direction. The spacing between lenses 330 matches the fast-axis spacing $S_F$ of the fiber ends. The beams, individually collimated in the slow-axis and in the fast-axis by arrays are then delivered for fiber laser pumping. The focal length of lenses in each array is selected such that the beams "stack" with minimal gaps ("dark space") between the beams.

Figure 23:
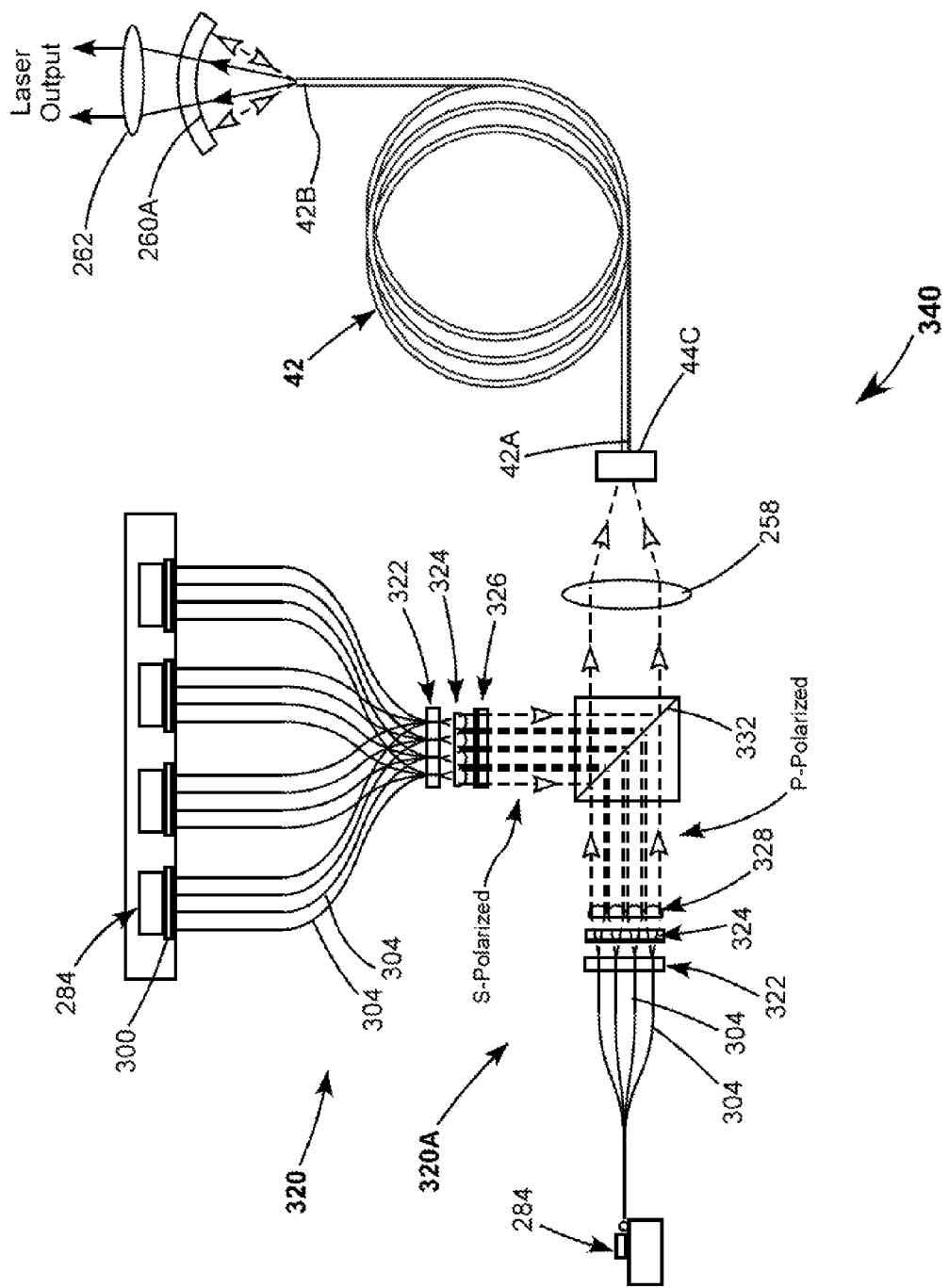
FIG. 23 schematically illustrates schematically illustrates another preferred embodiment of a diode-laser fiber-array-package (FAP) pumped fiber laser in accordance with the present invention, similar to the laser of FIG. 19 with pump-radiation supplied by two pump-radiation sources similar to the source of FIG. 22, with sources and accordingly polarization-planes thereof rotated at 90-degrees to each other, and with the pump radiations having the same wavelength and being combined by a polarization-selective beam-combiner.

FIG. 23 schematically illustrates schematically illustrates another preferred embodiment 340 of a diode-laser fiber-array-package (FAP) pumped fiber-laser in accordance with the present invention. Laser 340 is similar to laser of FIG. 19 but with pump-radiation supplied by two pump-radiation sources similar to the source of FIG. 22, with sources and accordingly polarization-planes thereof rotated at 90-degrees to each other.

One source is designated as source 320 and the other as source 320A. Each source provides radiation at the same wavelength (here 976 nm). Radiation from the sources is polarization combined by a polarization-selective beam-combiner 332.

Radiation for source 320 is s-polarized with respect to beam-combiner 332. Radiation for source 320A is p-polarized with respect to beam-combiner 332. Minor 44B of laser 280 is replaced in laser 340 by a mirror 44C which is highly reflective for the laser radiation and highly transmissive for the pump-radiation. Mirror 260 of laser 280 is replaced in laser 340 by a mirror 260A which is highly transparent for the laser radiation and highly reflective for the p which is highly reflective for the laser radiation and highly transmissive for the pump-radiation.

FIG. 24 is a three-dimensional view schematically illustrating another example 360. Source 360 is similar to source 320 of FIG. 22 with an exception as follows. In source 360 fibers 304A replace fibers 304 of source 320. FIG. 24A is a fragmentary view of a rectangular fiber-array in fiber-array template 322A of FIG. 24. This schematically illustrates fibers 304A, which have the rectangular core of fibers 304 but are surrounded by a cladding 308A having an elliptical cross-section. Here the major and minor axes of the elliptical cross-section (not explicitly shown) are aligned with the width and height respectively, of the rectangular fiber core. The fibers fit in corresponding elliptical holes (also not explicitly shown) in the array template (fiber holder). This greatly facilitates parallel alignment of the widths and heights of the fiber cores. A similar template arrangement (not shown) can be provided for facilitating alignment of the rectangular fiber cores with the rectangular emitters of the diode-laser bar.

Further, in source 360, it is assumed that the divergences of beams from fibers 304A in the fast-axis and the slow-axis are about the same. This permits replacing crossed cylindrical-lens arrays 324 and 326 of source 320 with a single array 362 of sixteen individual spherical lenses 364 having optical power in the fast-axis and in the slow-axis. One advantage of the single array of spherical lenses is that the lenses can be packed hexagonally to limit unused (dark) space between the lenses. The ends of the optical fibers in template 322A would of course need to be correspondingly hexagonally arrayed.

The fiber-laser of the present invention is described above in terms of several embodiments and examples with detailed drawings and descriptions of important functional elements. The present invention is not limited, however, to the embodiments and examples described and depicted. Rather, the invention is limited only by the claims appended hereto.

What is claimed is:

1. Optical apparatus, comprising:
a gain-fiber having first and second opposite ends and having a fundamental emission wavelength for laser radiation;
a source of optical pump-radiation including a plurality of diode-laser bars, each thereof having a plurality of diode-laser emitters therein, with each emitter delivering radiation into a corresponding one of a plurality of optical fibers having a rectangular core, with sides of the rectangular core aligned with the fast- and slow-axes of the emitter at a proximal end of the fiber, and wherein distal ends of the fibers are formed into a two-dimensional array of columns and rows and with sides of the rectangular cores in each column and each row parallel to each other to create a two dimensional array of radiation beams;
collimating optics arranged to collimate the individual radiation beams emitted from the distal ends of each of the rectangular-core fibers while maintaining the propagation of the beams in the two dimensional array; and
a focusing lens arranged to focus the collimated radiation beams from rectangular-core fibers into the first end of the gain-fiber.

2. The apparatus of claim 1, wherein the collimating optics includes a first plurality of cylindrical lenses arranged to collimate radiation from the rectangular-core fibers in the fast-axis direction and a second plurality of cylindrical lenses arranged to collimate the radiation from the rectangular-core fibers in the slow-axis direction.

3. The apparatus of claim 1, wherein the collimating optics includes a plurality of lenses corresponding in number to the plurality of rectangular-core fibers and arranged to collimate distal ends of the rectangular-core fibers in both the fast-axis and the slow-axis.

4. Optical apparatus, comprising:
a gain-fiber having first and second opposite ends and having a fundamental emission wavelength for laser radiation;
first source and second sources of optical pump-radiation each of the sources of optical pump radiation including a plurality of diode-laser bars, each thereof having a plurality of diode-laser emitters therein, with each emitter delivering radiation into a corresponding one of a plurality of optical fibers having a rectangular core, with sides of the rectangular core aligned with the fast- and slow-axes of the emitter at a proximal end of the fiber, and wherein distal ends of the fibers are formed in to a two-dimensional array of columns and rows with sides of the rectangular cores in each column and row parallel to each other to create a two dimensional array of radiation beams;
collimating optics arranged to collimate the individual radiation beams emitted from the distal ends of each of the rectangular-core fibers while maintaining the propagation of the beams in the two dimensional array;
a beam-combiner arranged to combine the collimated radiation beams from rectangular-core fibers of the first and second pump-radiation sources; and
focusing lens arranged to focus the combined collimated radiation beams from the rectangular-core fibers into the first end of the gain-fiber.

5. The apparatus of claim 4, wherein the pump-radiation from the first source has a wavelength different from that of the pump radiation from the second source and the beam combiner is a dichroic beam combiner.

6. The apparatus of claim 4, wherein pump-radiation from the distal ends of the rectangular-core fibers of both pump-radiation sources is plane-polarized, with the polarization-orientation from the rectangular-core fibers of the first source of pump-radiation being perpendicular to the polarization-orientation from the rectangular-core fibers of the second source of pump radiation, and wherein the beam-combiner is a polarization-selective beam-combiner.

7. The apparatus of claim 6, wherein pump-radiation from both sources has the same wavelength.

8. The apparatus of claim 4, wherein the collimating optics includes a first plurality of cylindrical lenses arranged to collimate radiation from the rectangular-core fibers in the fast-axis direction and a second plurality of cylindrical lenses arranged to collimate the radiation from the rectangular-core fibers in the slow-axis direction.

9. The apparatus of claim 4, wherein the collimating optics includes a plurality of lenses corresponding in number to the plurality of rectangular-core fibers and arranged to collimate distal ends of the rectangular-core fibers in both the fast-axis and the slow-axis.

* * * * *